United States Patent
Chou et al.

(10) Patent No.: US 12,183,632 B2
(45) Date of Patent: Dec. 31, 2024

(54) BOTTOM LATERAL EXPANSION OF CONTACT PLUGS THROUGH IMPLANTATION

(71) Applicant: Taiwan Semiconductor Manufacturing Co., Ltd., Hsinchu (TW)

(72) Inventors: Meng-Han Chou, Hsinchu (TW);
Su-Hao Liu, Jhongpu Township (TW);
Kuo-Ju Chen, Taichung (TW);
Liang-Yin Chen, Hsinchu (TW);
Huicheng Chang, Tainan (TW);
Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 93 days.

(21) Appl. No.: 17/814,981

(22) Filed: Jul. 26, 2022

(65) Prior Publication Data
US 2022/0359286 A1    Nov. 10, 2022

Related U.S. Application Data

(62) Division of application No. 17/001,247, filed on Aug. 24, 2020, now Pat. No. 11,502,000.

(51) Int. Cl.
*H01L 21/768* (2006.01)
*H01L 21/285* (2006.01)
(Continued)

(52) U.S. Cl.
CPC .. *H01L 21/76895* (2013.01); *H01L 21/28518* (2013.01); *H01L 21/31111* (2013.01);
(Continued)

(58) Field of Classification Search
CPC ......... H01L 21/76895; H01L 21/28518; H01L 21/31111; H01L 21/32133; H01L 21/3215;
(Continued)

(56) References Cited

U.S. PATENT DOCUMENTS 7,622,391 B2   11/2009  Frohberg et al.
7,851,924 B2   12/2010  Arakawa
(Continued)

FOREIGN PATENT DOCUMENTS

CN    109860050 A    6/2019
DE    102006035645 A1   2/2008
(Continued)

*Primary Examiner* — Farun Lu
(74) *Attorney, Agent, or Firm* — Slater Matsil, LLP

(57) ABSTRACT

A method includes forming a metallic feature, forming an etch stop layer over the metallic feature, implanting the metallic feature with a dopant, forming a dielectric layer over the etch stop layer, performing a first etching process to etch the dielectric layer and the etch stop layer to form a first opening, performing a second etching process to etch the metallic feature and to form a second opening in the metallic feature, wherein the second opening is joined with the first opening, and filling the first opening and the second opening with a metallic material to form a contact plug.

20 Claims, 26 Drawing Sheets

(51) Int. Cl.
*H01L 21/311* (2006.01)
*H01L 21/3213* (2006.01)
*H01L 21/3215* (2006.01)
*H01L 23/532* (2006.01)
*H01L 23/535* (2006.01)
*H01L 29/08* (2006.01)
*H01L 29/417* (2006.01)
*H01L 29/45* (2006.01)
*H01L 29/66* (2006.01)
*H01L 29/78* (2006.01)

(52) U.S. Cl.
CPC .... *H01L 21/32133* (2013.01); *H01L 21/3215* (2013.01); *H01L 21/76805* (2013.01); *H01L 21/76829* (2013.01); *H01L 21/7684* (2013.01); *H01L 21/76892* (2013.01); *H01L 23/53257* (2013.01); *H01L 23/535* (2013.01); *H01L 29/0847* (2013.01); *H01L 29/41791* (2013.01); *H01L 29/45* (2013.01); *H01L 29/66795* (2013.01); *H01L 29/7851* (2013.01)

(58) Field of Classification Search
CPC ......... H01L 21/76805; H01L 21/76829; H01L 21/7684; H01L 21/76892; H01L 23/53257; H01L 23/535; H01L 29/0847; H01L 29/41791; H01L 29/45; H01L 29/66795; H01L 29/7851; H01L 21/32135; H01L 21/76825; H01L 21/76883; H01L 23/485; H01L 23/5226; H01L 29/785; H01L 21/32134; H01L 21/823431; H01L 21/823475; H01L 27/0886; H01L 21/76834
See application file for complete search history.

(56) References Cited

U.S. PATENT DOCUMENTS

| | | |
|---|---|---|
| 10,361,119 B1 | 7/2019 | Motoyama et al. |
| 11,362,003 B2 | 6/2022 | Lee et al. |
| 2004/0102035 A1 | 5/2004 | Lee |
| 2005/0245065 A1 | 11/2005 | Motoyama |
| 2006/0125100 A1 | 6/2006 | Arakawa |
| 2008/0026564 A1* | 1/2008 | Frohberg .......... H01L 21/76847 438/637 |
| 2008/0079090 A1 | 4/2008 | Hwang et al. |
| 2009/0079077 A1 | 3/2009 | Yang et al. |
| 2009/0227087 A1 | 9/2009 | Ramappa et al. |
| 2010/0320604 A1 | 12/2010 | Isobayashi |
| 2014/0264922 A1 | 9/2014 | Chen et al. |
| 2015/0061024 A1 | 3/2015 | Li et al. |
| 2016/0172296 A1 | 6/2016 | Lim et al. |
| 2018/0294184 A1* | 10/2018 | Koh ................ H01L 21/823475 |
| 2019/0088542 A1 | 3/2019 | Hsieh et al. |
| 2019/0157148 A1* | 5/2019 | Hsieh ................. H01L 27/0886 |
| 2019/0304833 A1 | 10/2019 | Chen et al. |
| 2019/0305107 A1 | 10/2019 | Chen et al. |
| 2020/0051858 A1 | 2/2020 | Chen et al. |
| 2020/0105586 A1 | 4/2020 | Hsu et al. |

FOREIGN PATENT DOCUMENTS

| | | |
|---|---|---|
| DE | 102018125000 A1 | 5/2019 |
| JP | H0822999 A | 1/1996 |
| JP | H11163132 A | 6/1999 |
| JP | 2005251991 A | 9/2005 |
| KR | 20040031366 A | 4/2004 |
| KR | 20060065512 A | 6/2006 |
| KR | 100791345 B1 | 1/2008 |
| KR | 20090022802 A | 3/2009 |
| KR | 20150026712 A | 3/2015 |
| KR | 20160030390 A | 3/2016 |
| KR | 20160070896 A | 6/2016 |
| KR | 20180131346 A | 12/2018 |

* cited by examiner

BOTTOM LATERAL EXPANSION OF CONTACT PLUGS THROUGH IMPLANTATION

PRIORITY CLAIM AND CROSS-REFERENCE

This application is a divisional of U.S. patent application Ser. No. 17/001,247, entitled "Bottom Lateral Expansion of Contact Plugs Through Implantation," filed on Aug. 24, 2020, which application is incorporated herein by reference

BACKGROUND

In the manufacturing of integrated circuits, contact plugs are used for electrically coupling to the source and drain regions and the gates of transistors. The source/drain contact plugs were typically connected to source/drain silicide regions, whose formation processes include forming contact openings to expose source/drain regions, depositing a metal layer, depositing a barrier layer over the metal layer, performing an anneal process to react the metal layer with the source/drain regions, filling a metal such as tungsten or cobalt into the remaining contact opening, and performing a Chemical Mechanical Polish (CMP) process to remove excess metal. There may be more than one level of contact plugs formed.

Conventionally, when forming upper-level contact plugs, the bottom portions of upper-level contact plugs were expanded to solve problems such as the corrosions of the lower-level contact plugs. The bottom portions extend into the lower-level contact plugs. The lateral expansion, however, was difficult to achieve since the lateral expansion will cause the openings in which the upper-level contact plugs are formed to be deeper.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
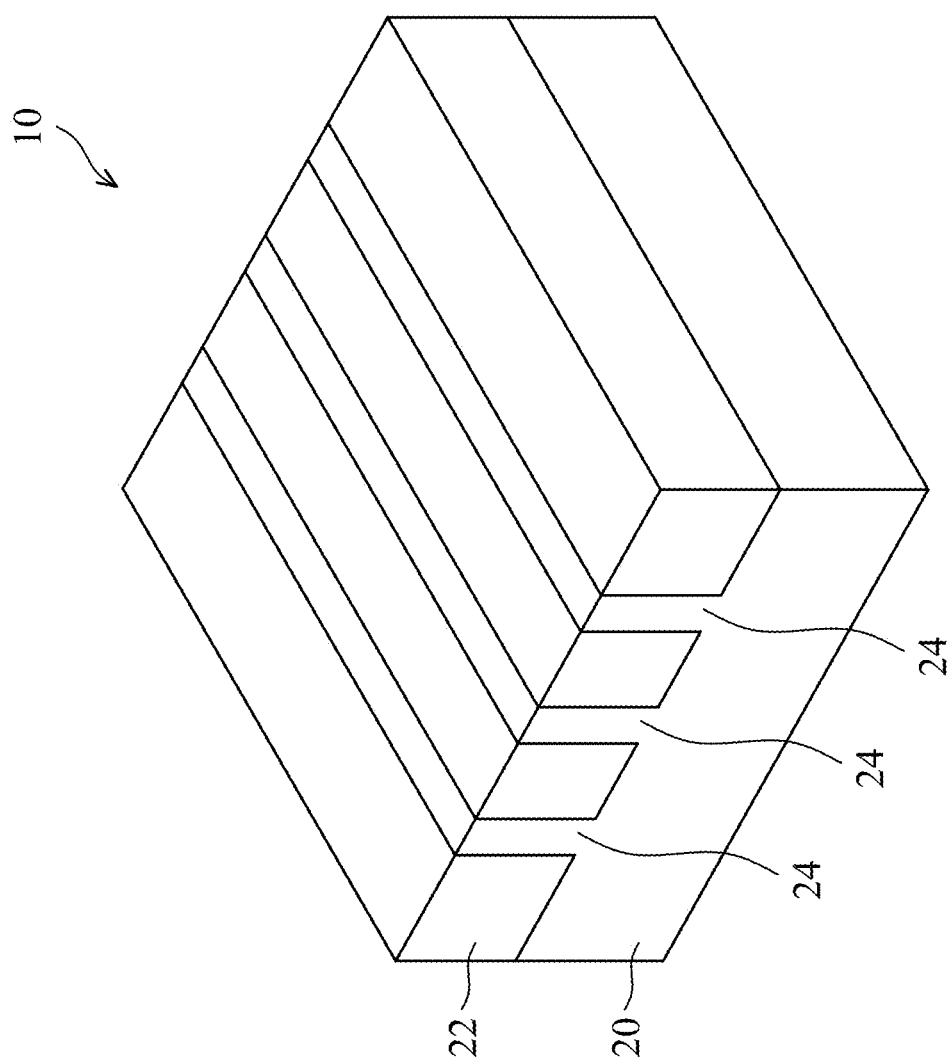
FIGS. 1-7, 8A, 8B, 9A, 9B, 10A, 10B, 11, 12A, 12B, and 13-17 are perspective views and cross-sectional views of intermediate stages in the formation of a transistor and the respective contact plugs in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A contact plug and the method of forming the same are provided in accordance with some embodiments. An upper contact plug is formed over a lower contact plug. An implantation process is performed to dope a dopant into a top portion of the lower contact plug. A dielectric layer is formed over the lower contact plug, and a contact opening is formed in the dielectric layer. The lower contact plug is then recessed both vertically and laterally. With the dopant in the top portion of the lower contact plug, the lateral recessing rate is increased relative to the vertical recessing rate. Accordingly, the bottom portion of the upper contact plug is enlarged laterally much more than being enlarged vertically. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-7, 8A, 8B, 9A, 9B, 10A, 10B, 11, 12A, 12B, and 13-17 illustrate the cross-sectional views of intermediate stages in the formation of a Fin Field-Effect Transistor (FinFET) and the corresponding contact plugs in accordance with some embodiments of the present disclosure. The corresponding processes are also reflected schematically in the process flow shown in FIG. 22.

FIG. 1 illustrates a perspective view of an initial structure formed on wafer 10. Wafer 10 includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The respective process is illustrated as process 202 in the process flow 200 shown in FIG. 22. The portions of substrate 20 between neighboring STI regions 22 are referred to as semiconductor strips 24. The top surfaces of semiconductor strips 24 and the top surfaces of STI regions 22 may be substantially level with each other. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy process to regrow another semiconductor material in the recesses. Accordingly, semiconductor strips 24 are formed of a semiconductor material different from that of substrate 20. In accordance with some embodiments, semiconductor strips 24 are formed of silicon germanium, silicon carbon, or a III-V compound semiconductor material.

STI regions 22 may include a liner oxide (not shown), which may be a thermal oxide formed through the thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), Chemical Vapor Deposition (CVD), or the like. STI regions 22 may also include a dielectric material over the liner oxide, wherein the dielectric material may be formed using Flowable Chemical Vapor Deposition (FCVD), spin-on coating, or the like.

Figure 2:
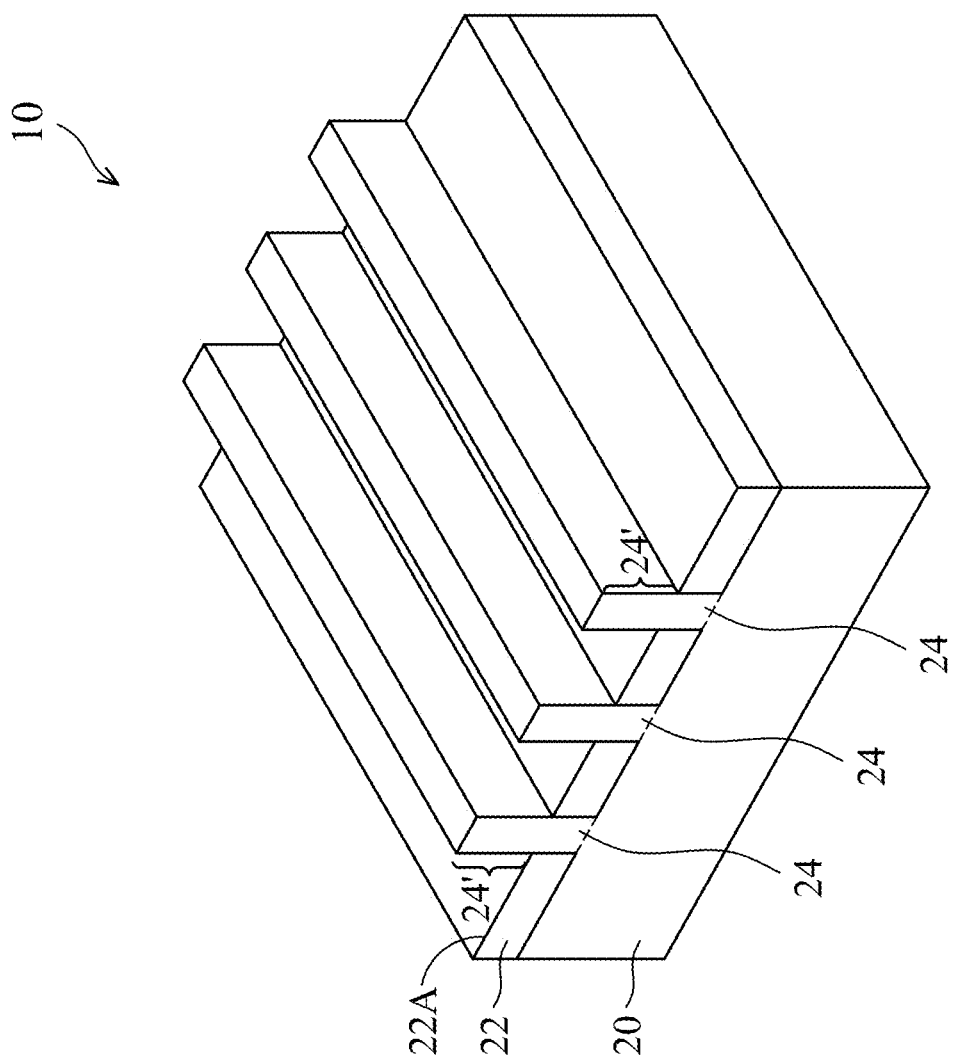

Referring to FIG. 2, STI regions 22 are recessed, so that the top portions of semiconductor strips 24 protrude higher than the top surfaces 22A of the remaining portions of STI regions 22 to form protruding fins 24'. The respective process is illustrated as process 204 in the process flow 200 shown in FIG. 22. The etching may be performed using a dry etching process, wherein $NF_3$ and $NH_3$ are used as the etching gases. During the etching process, plasma may be generated. Argon may also be included. In accordance with alternative embodiments of the present disclosure, the recessing of STI regions 22 is performed using a wet etching process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3:
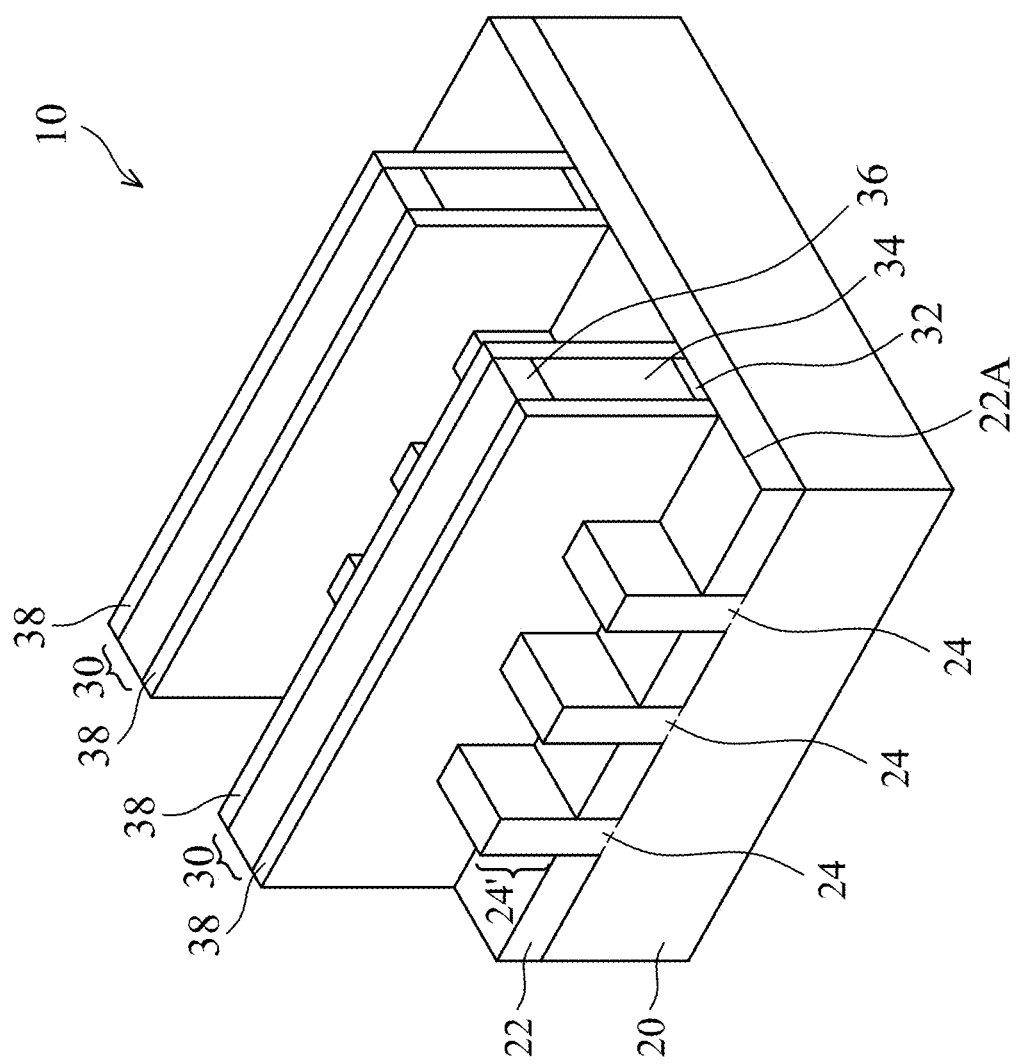

Referring to FIG. 3, dummy gate stacks 30 are formed to extend on the top surfaces and the sidewalls of (protruding) fins 24'. The respective process is illustrated as process 206 in the process flow 200 shown in FIG. 22. Dummy gate stacks 30 may include dummy gate dielectrics 32 and dummy gate electrodes 34 over the respective dummy gate dielectrics 32. Dummy gate electrodes 34 may be formed, for example, using polysilicon, and other materials may also be used. Each of dummy gate stacks 30 may also include one (or a plurality of) hard mask layer 36 over dummy gate electrodes 34. Hard mask layers 36 may be formed of silicon nitride, silicon oxide, silicon oxy-nitride, or multi-layers thereof. Dummy gate stacks 30 may cross over a single one or a plurality of protruding fins 24' and/or STI regions 22.

Dummy gate stacks 30 also have lengthwise directions perpendicular to the lengthwise directions of protruding fins 24'.

Next, gate spacers 38 are formed on the sidewalls of dummy gate stacks 30. The respective process is also illustrated as process 206 in the process flow 200 shown in FIG. 22. In accordance with some embodiments of the present disclosure, gate spacers 38 are formed of a dielectric material(s) such as silicon nitride, silicon carbo-nitride, or the like, and may have a single-layer structure or a multi-layer structure including a plurality of dielectric layers.

Figure 4:
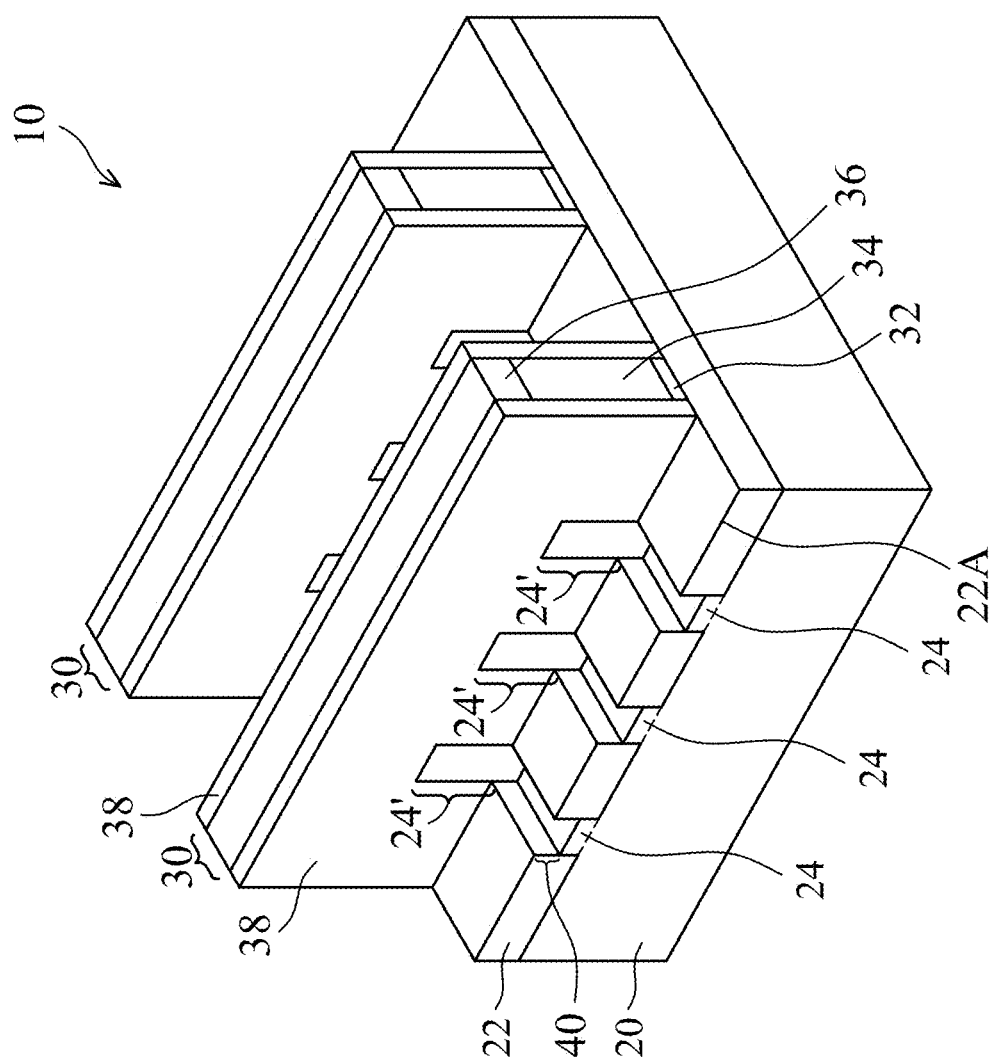

An etching step is then performed to etch the portions of protruding fins 24' that are not covered by dummy gate stack 30 and gate spacers 38, resulting in the structure shown in FIG. 4. The respective process is illustrated as process 208 in the process flow 200 shown in FIG. 22. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. The spaces left by the etched protruding fins 24' and semiconductor strips 24 are referred to as recesses 40. Recesses 40 are located on the opposite sides of dummy gate stacks 30.

Figure 5:
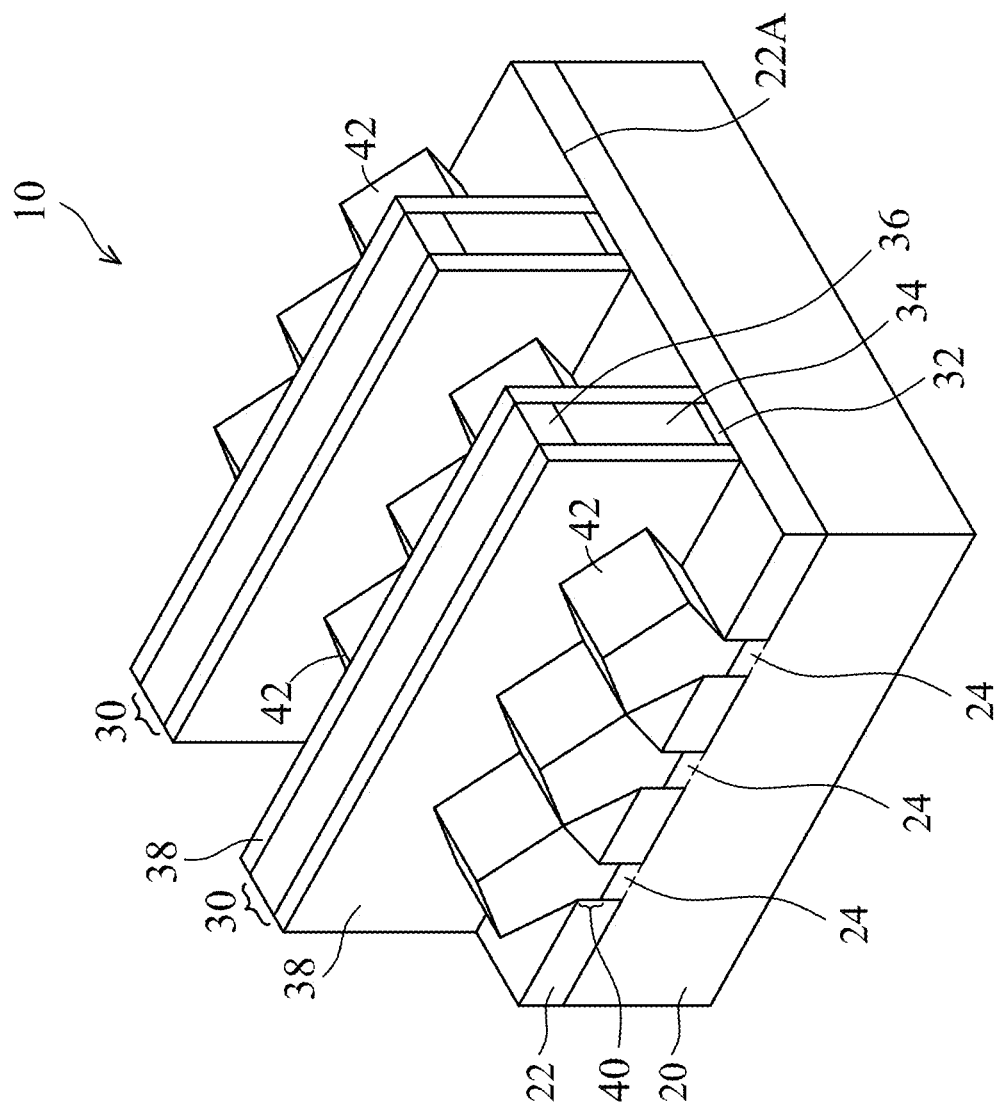
Figure 6:
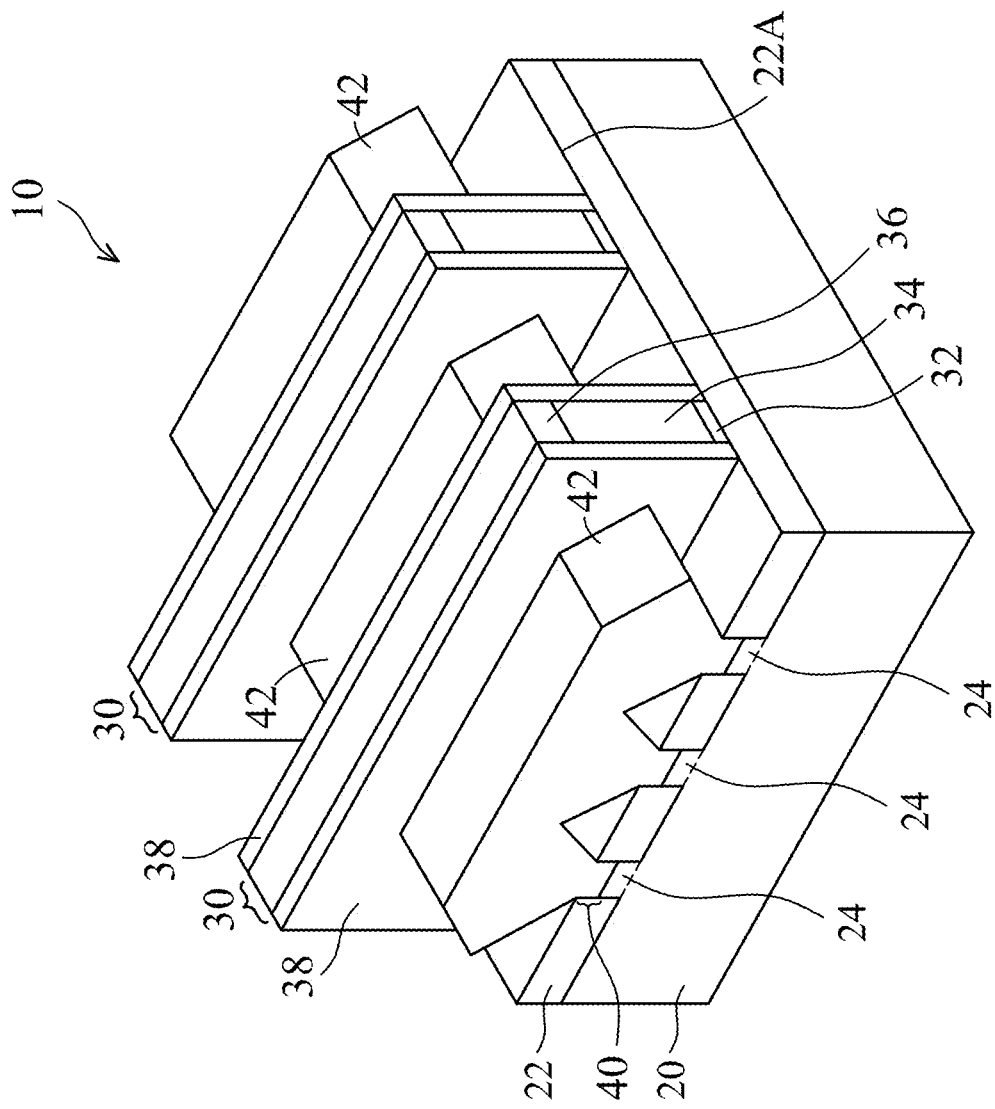

Next, as shown in FIG. 5, epitaxy regions (source/drain regions) 42 are formed by selectively growing (through epitaxy) a semiconductor material in recesses 40. The respective process is illustrated as process 210 in the process flow 200 shown in FIG. 22. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 42 comprise III-V compound semiconductors such as GaAs, InP, GaN, InGaAs, InAlAs, GaSb, AlSb, AlAs, AlP, GaP, combinations thereof, or multi-layers thereof. After Recesses 40 are filled with epitaxy regions 42, the further epitaxial growth of epitaxy regions 42 causes epitaxy regions 42 to expand horizontally, and facets may be formed. The further growth of epitaxy regions 42 may also cause neighboring epitaxy regions 42 to merge with each other. Voids (air gaps) 44 may be generated. In accordance with some embodiments of the present disclosure, the formation of epitaxy regions 42 may be finished when the top surface of epitaxy regions 42 is still wavy, or when the top surface of the merged epitaxy regions 42 has become planar, which is achieved by further growing on the epitaxy regions 42 as shown in FIG. 6.

After the epitaxy step, epitaxy regions 42 may be further implanted with a p-type or an n-type impurity to form source and drain regions, which are also denoted using reference numeral 42. In accordance with alternative embodiments of the present disclosure, the implantation step is skipped when epitaxy regions 42 are in-situ doped with the p-type or n-type impurity during the epitaxy.

Figure 7:
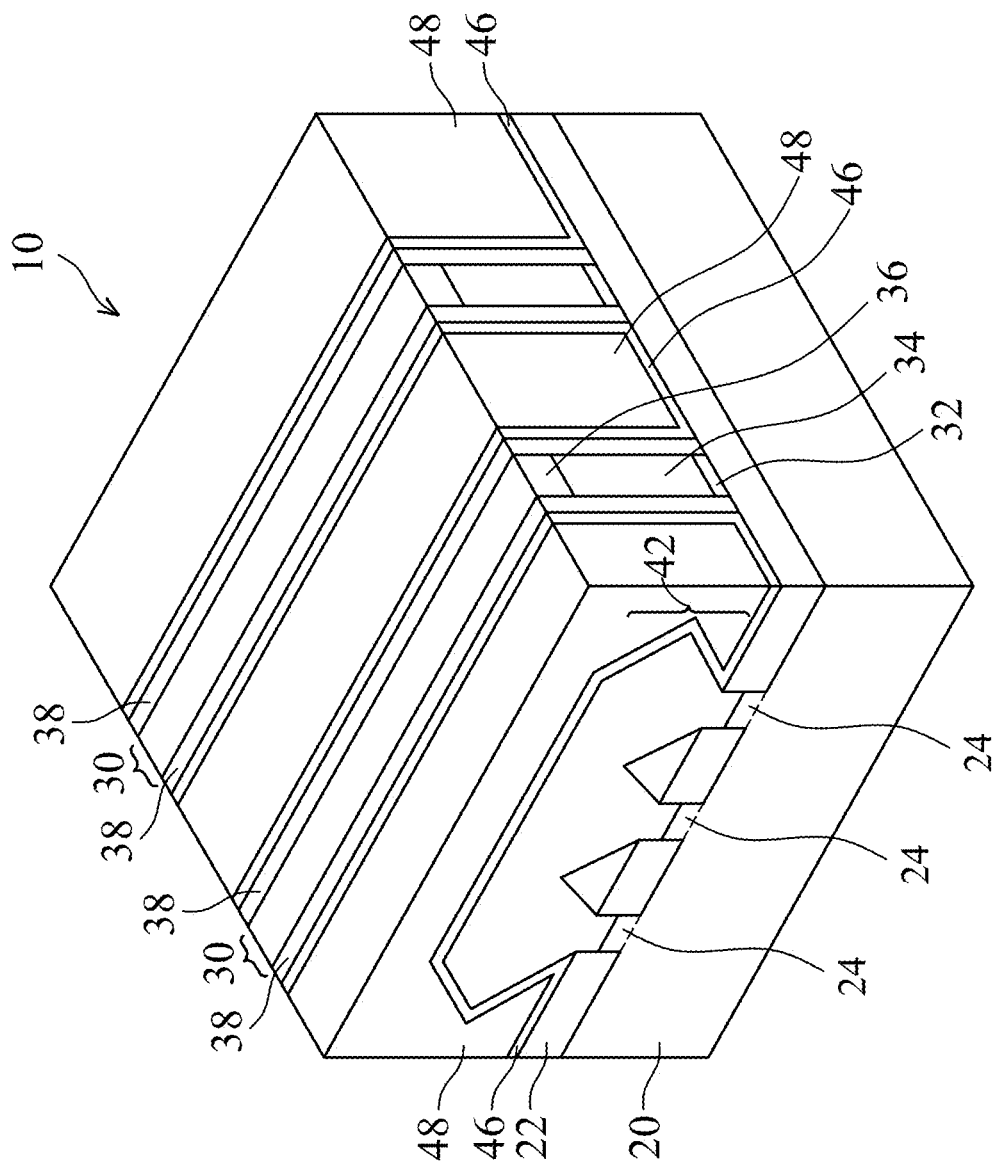

FIG. 7 illustrates a perspective view of the structure after the formation of Contact Etch Stop Layer (CESL) 46 and Inter-Layer Dielectric (ILD) 48. The respective process is illustrated as process 212 in the process flow 200 shown in FIG. 22. CESL 46 may be formed of silicon oxide, silicon nitride, silicon carbo-nitride, or the like, and may be formed using CVD, ALD, or the like. ILD 48 may include a dielectric material formed using, for example, FCVD, spin-on coating, CVD, or another deposition method. ILD 48 may be formed of an oxygen-containing dielectric material, which may be a silicon-oxide based dielectric material such as silicon oxide (formed using Tetra Ethyl Ortho Silicate (TEOS) as a process gas, for example), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process may be performed to level the top surfaces of ILD 48, dummy gate stacks 30, and gate spacers 38 with each other.

Figure 8A:
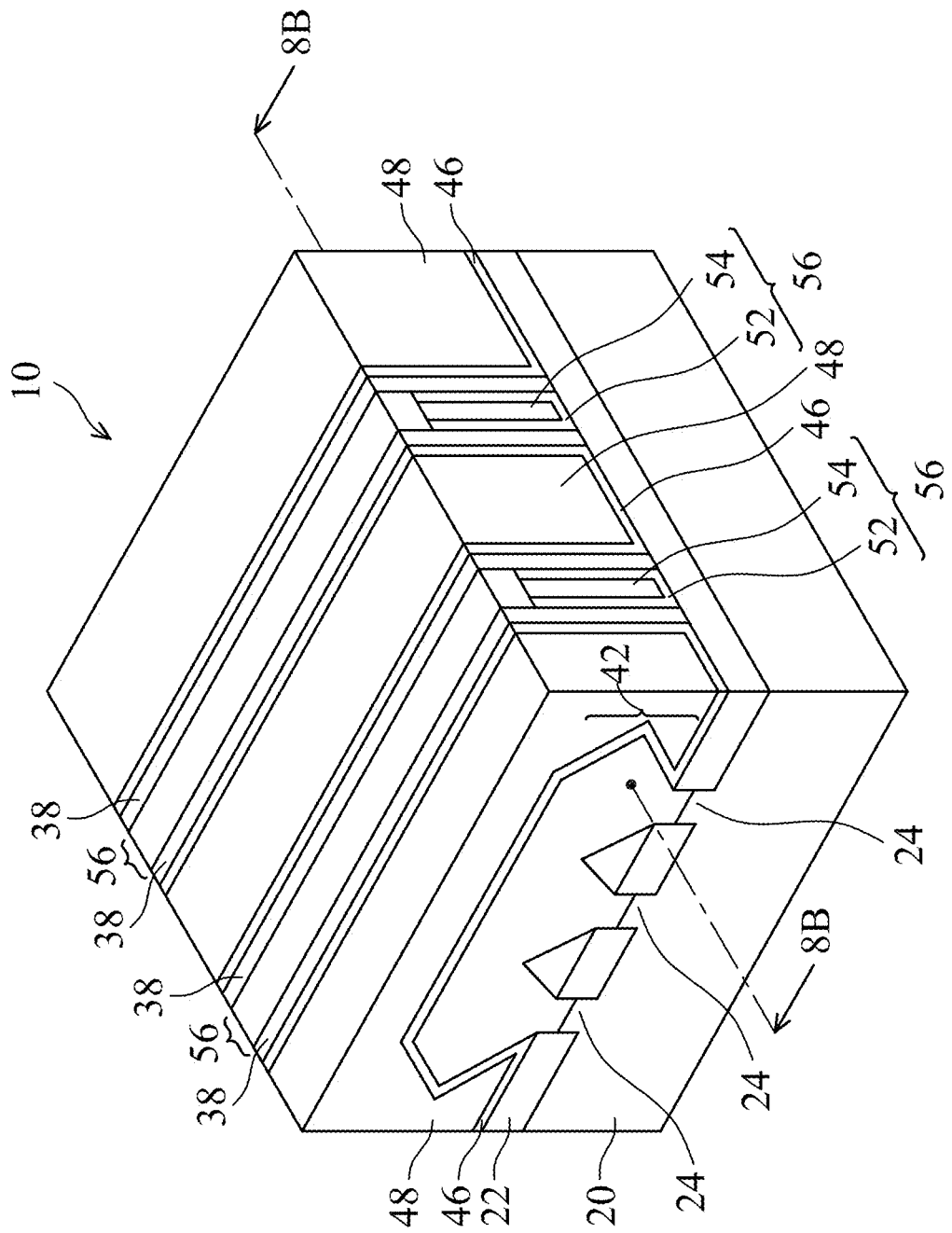
Figure 8B:
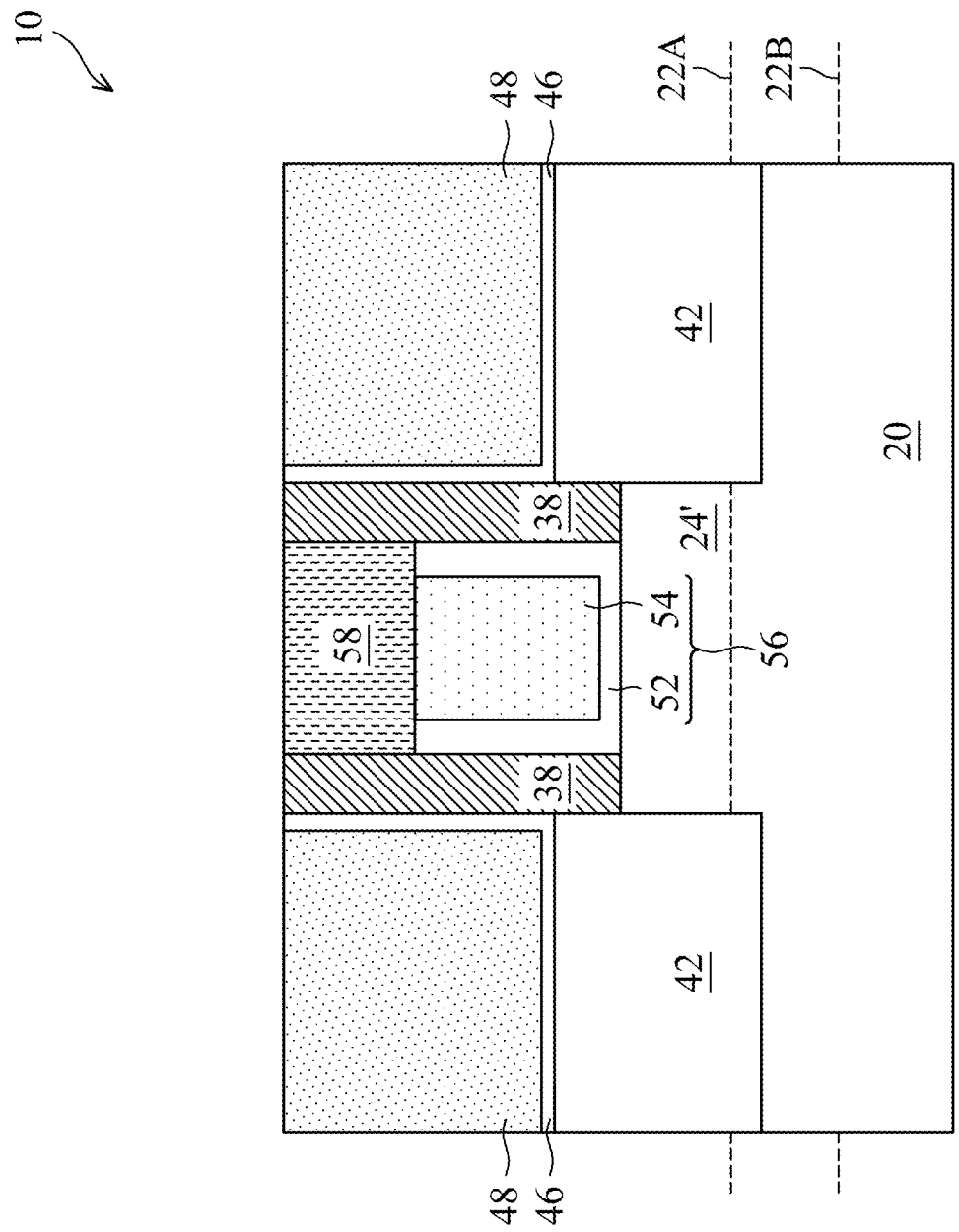

Next, dummy gate stacks 30, which include hard mask layers 36, dummy gate electrodes 34, and dummy gate dielectrics 32, are replaced with replacement gate stacks 56, which include metal gate electrodes 54 and gate dielectrics 52 as shown in FIGS. 8A and 8B. The respective process is illustrated as process 214 in the process flow 200 shown in FIG. 22. When forming replacement gate stacks 56, hard mask layers 36, dummy gate electrodes 34, and dummy gate dielectrics 32 as shown in FIG. 7 are first removed in one or a plurality of etching processes, resulting in trenches/openings to be formed between gate spacers 38. The top surfaces and the sidewalls of protruding semiconductor fins 24' are exposed to the resulting trenches.

Next, as shown in FIGS. 8A and 8B, which illustrate a perspective view and a cross-sectional view, respectively, replacement gate dielectric layers 52 are formed, which extend into the trenches between gate spacers 38. FIG. 8B illustrates the cross-section 8B-8B as shown in FIG. 8A. The top surfaces 22A and bottom surfaces 22B of STI regions are illustrated in FIG. 8B to show the positions of the illustrated features relative to the positions of STI regions. In accordance with some embodiments of the present disclosure, each of gate dielectric layers 52 includes an Interfacial Layer (IL) as its lower part, which contacts the exposed surfaces of the corresponding protruding fins 24'. The IL may include an oxide layer such as a silicon oxide layer, which is formed through the thermal oxidation of protruding fins 24', a chemical oxidation process, or a deposition process. Gate dielectric layer 52 may also include a high-k dielectric layer formed over the IL. The high-k dielectric layer may include a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. The high-k dielectric layer is formed as a conformal layer, and extends on the sidewalls of protruding fins 24' and the sidewalls of gate spacers 38. In accordance with some embodiments of the present disclosure, the high-k dielectric layer is formed using ALD or CVD.

Referring further to FIGS. 8A and 8B, gate electrodes 54 are formed over gate dielectrics 52. Gate electrodes 54 include stacked conductive layers. The stacked conductive layers are not shown separately, while the stacked conductive layers may be distinguishable from each other. The deposition of the stacked conductive layers may be performed using a conformal deposition method(s) such as ALD or CVD. The stacked conductive layers may include a diffusion barrier layer and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer and a TiN layer over the TaN layer. After the deposition of the work-function layer(s), a barrier (glue) layer, which may be another TiN layer, is formed. The barrier layer may or may not fully fill the trenches left by the removed dummy gate stacks.

The deposited gate dielectric layers and conductive layers are formed as conformal layers extending into the trenches, and include some portions over ILD 48. Next, if the barrier layer does not fully fill the trenches, a metallic material is deposited to fill the remaining trenches. The metallic material may be formed of tungsten or cobalt, for example. Subsequently, a planarization process such as a CMP process or a mechanical grinding process is performed, so that the portions of the gate dielectric layers, stacked conductive layers, and the metallic material over ILD 48 are removed. As a result, gate electrodes 54 and gate dielectrics 52 are formed. Gate electrodes 54 and gate dielectrics 52 are collectively referred to as replacement gate stacks 56. The top surfaces of replacement gate stacks 56, gate spacers 38, CESL 46, and ILD 48 may be substantially coplanar at this time.

FIGS. 8A and 8B also illustrate the formation of (self-aligned) hard masks 58 in accordance with some embodiments. The respective process is illustrated as process 216 in the process flow 200 shown in FIG. 22. The formation of hard masks 58 may include performing an etching process to recess gate stacks 56, so that recesses are formed between gate spacers 38, filling the recesses with a dielectric material, and then performing a planarization process such as a CMP process or a mechanical grinding process to remove excess portions of the dielectric material. Hard masks 58 may be formed of silicon nitride, silicon oxynitride, silicon oxy-carbo-nitride, or the like.

Figure 9A:
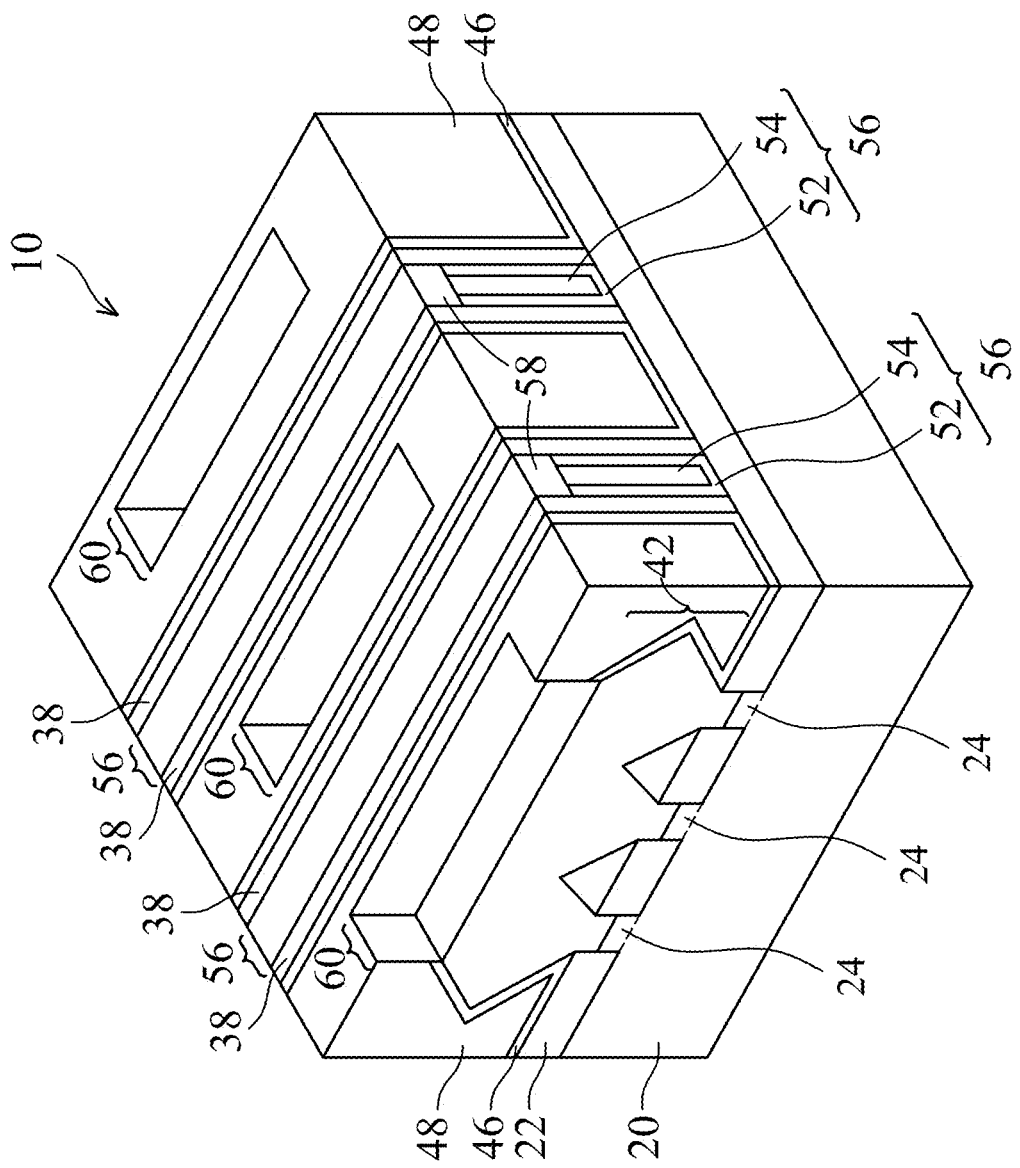
Figure 9B:
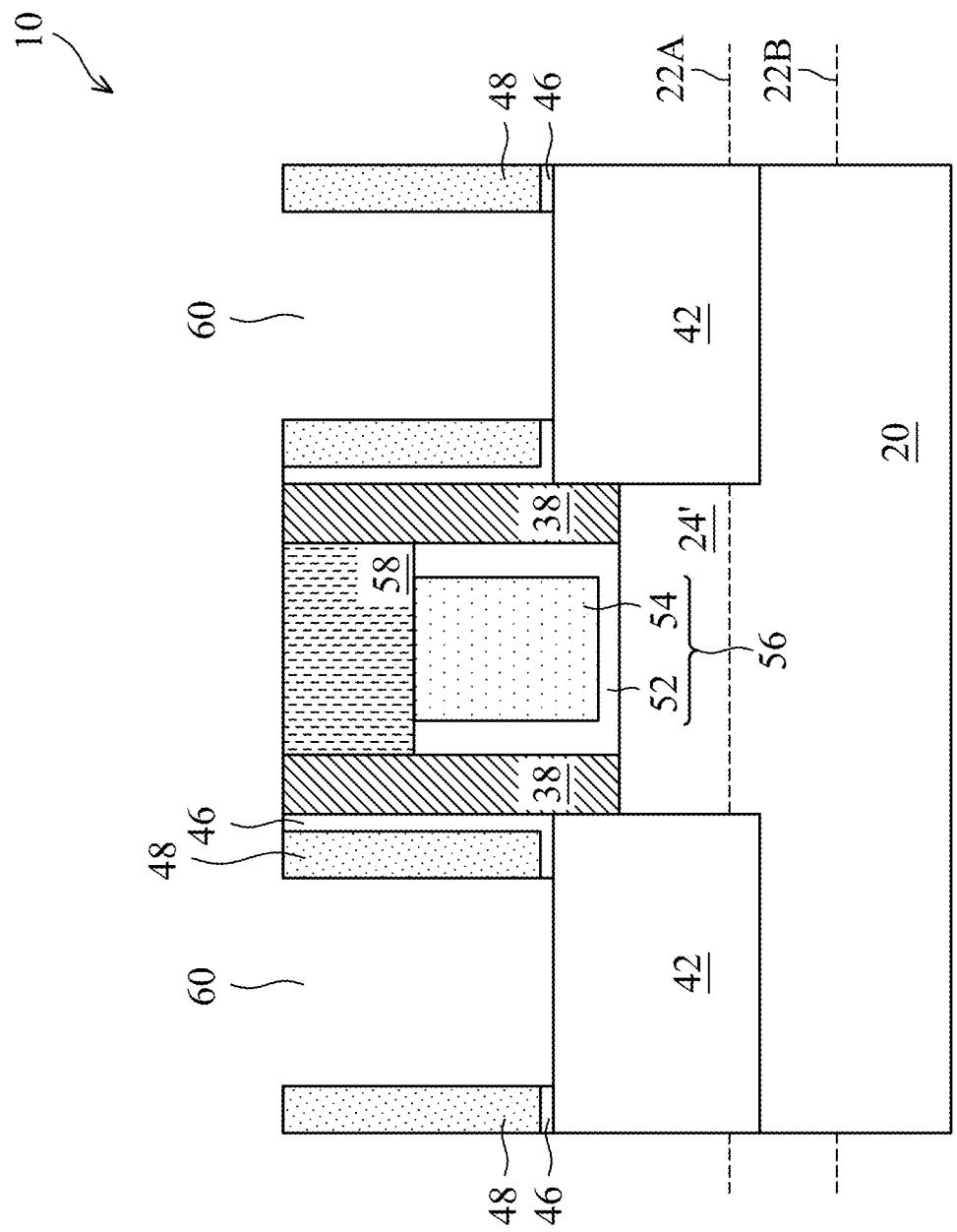

FIGS. 9A and 9B illustrate a perspective view and a cross-sectional view, respectively, in the formation of source/drain contact openings 60. The respective process is illustrated as process 218 in the process flow 200 shown in FIG. 22. The formation of contact openings 60 include etching ILD 48 to expose the underlying portions of CESL 46, and then etching the exposed portions of CESL 46 to reveal epitaxy regions 42. In accordance with some embodiments of the present disclosure, as illustrated in FIG. 9A, gate spacers 38 are spaced apart from the nearest contact openings 60 by some remaining portions of ILD 48. In accordance with other embodiments, the sidewalls of gate spacers or CESL 46 are exposed to contact openings 60.

Figure 10A:
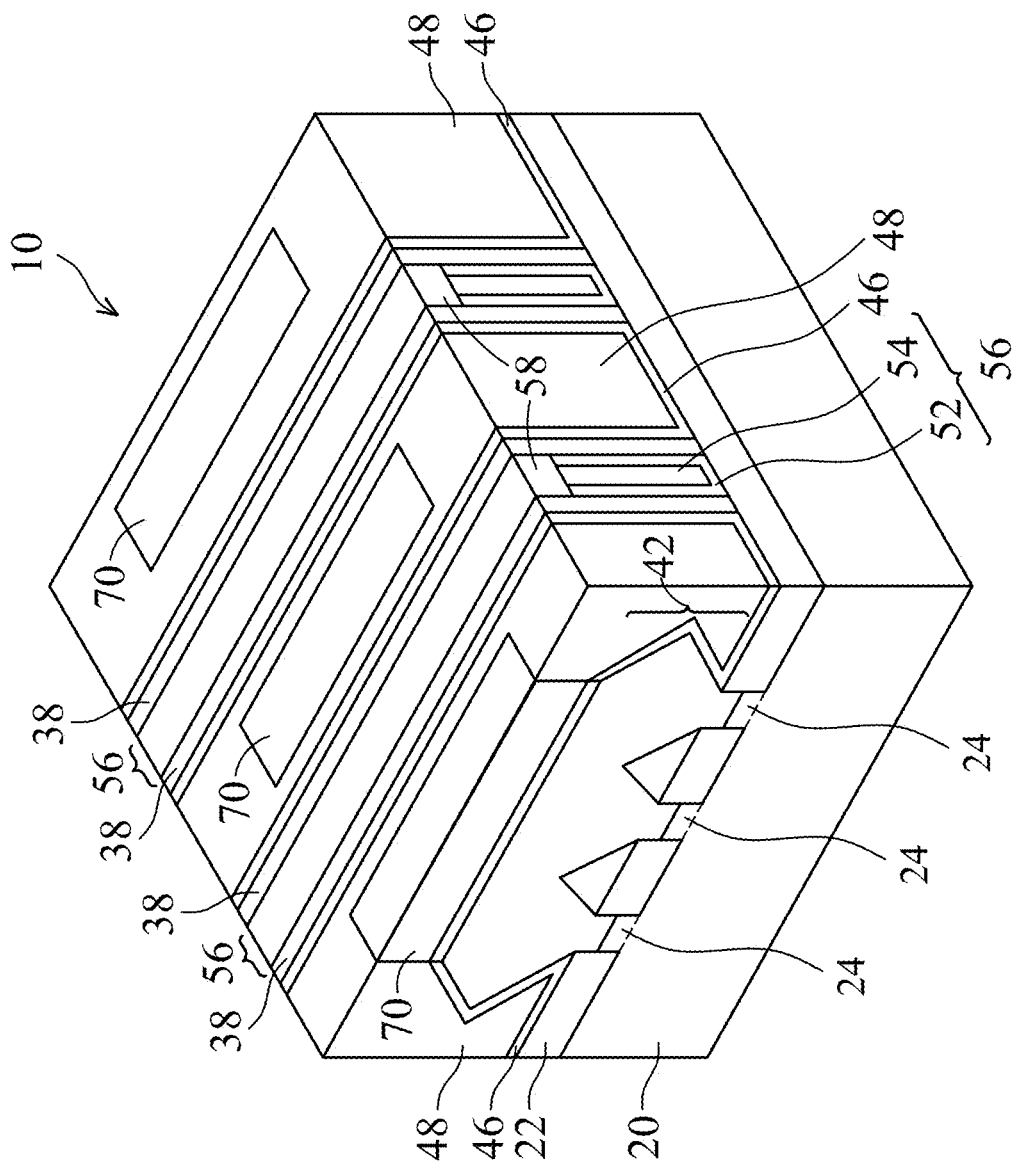
Figure 10B:
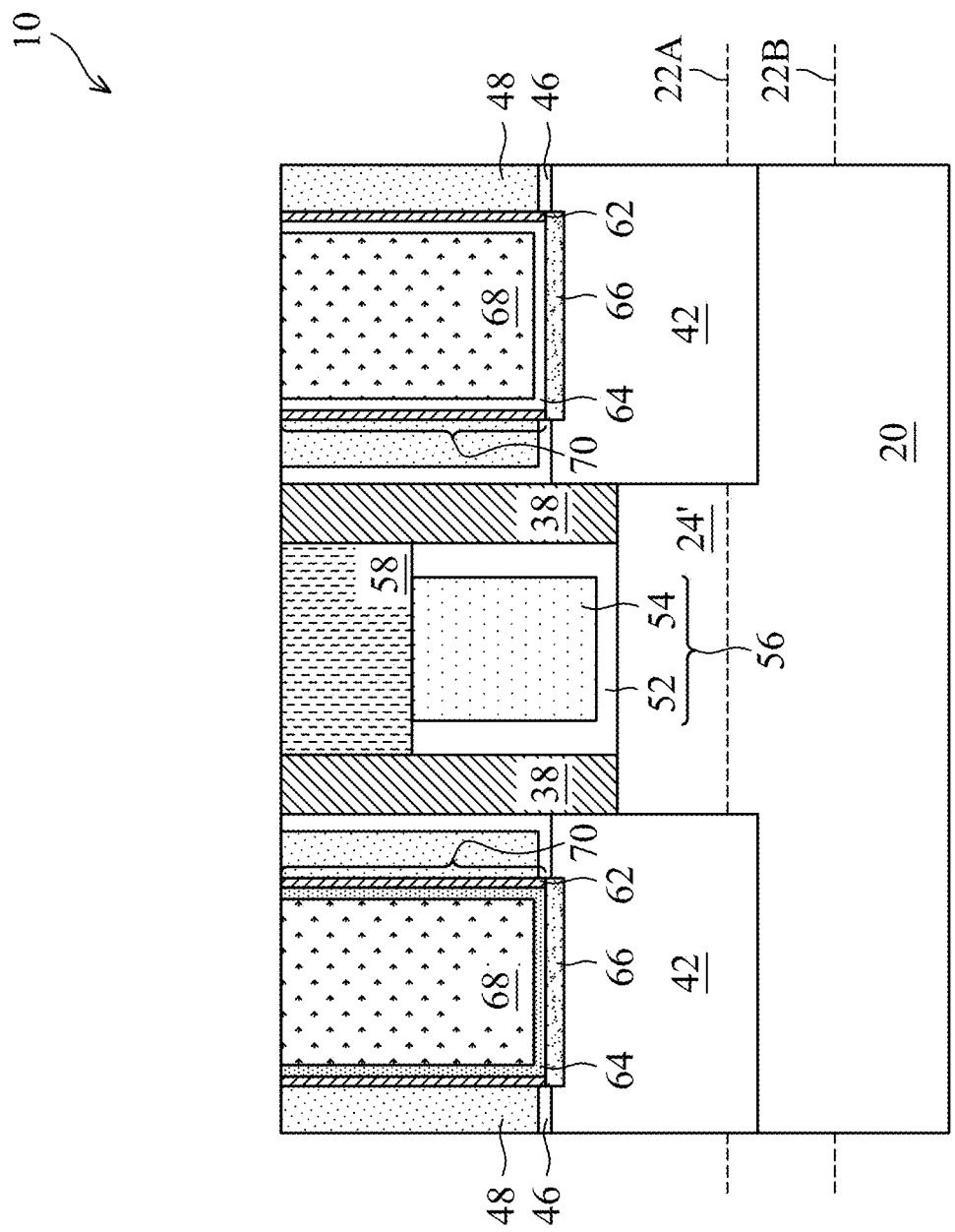

Referring to FIGS. 10A and 10B, silicide regions 66 and source/drain contact plugs 70 are formed. In accordance with some embodiments, metal layer 62 (such as a titanium layer or a cobalt layer, FIG. 10B) is deposited, for example, using Physical Vapor Deposition (PVD) or a like method. Metal layer 62 is a conformal layer, and extends onto the top surface of source/drain regions 42 and the sidewalls of ILD 48 and CESL 46. A metal nitride layer (such as a titanium nitride layer) 64 is then deposited as a capping layer. An annealing process is then performed to form source/drain silicide regions 66, as shown in FIGS. 10A and 10B. The respective process is illustrated as process 220 in the process flow 200 shown in FIG. 22. Next, a metallic material 68 such as cobalt, tungsten, or the like, is filled into the remaining portions of the contact openings. A planarization process such as a CMP process or a mechanical grinding process is then performed to remove excess portions of metal layer 62 and the metallic material, leaving contact plugs 70. The respective process is also illustrated as process 220 in the process flow 200 shown in FIG. 22.

Figure 11:
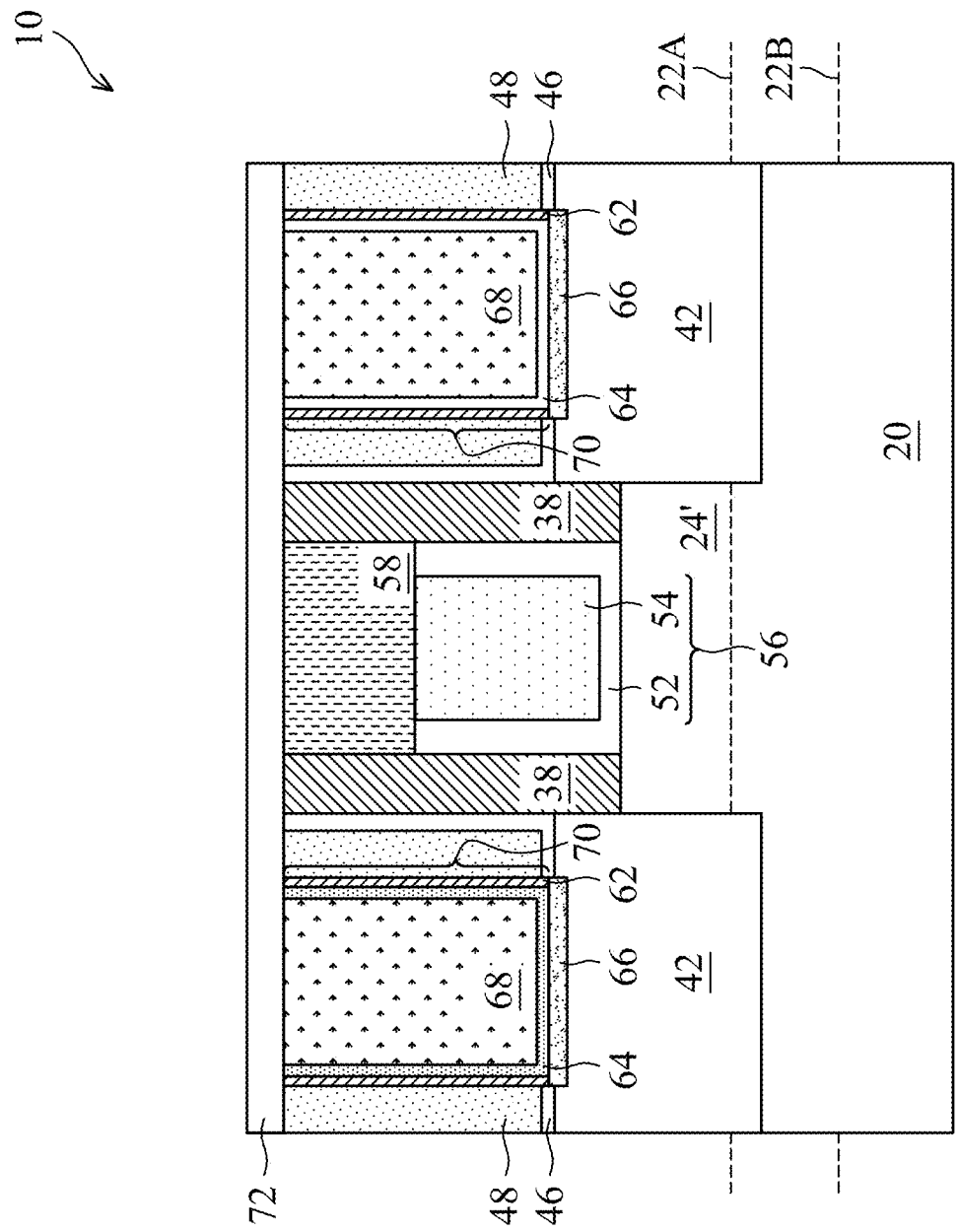

Referring to FIG. 11, etch stop layer 72 is deposited. The respective process is illustrated as process 222 in the process flow 200 shown in FIG. 22. Etch stop layer 72 may be formed of a silicon-containing material such as SiN, SiCN, SiC, SiOCN, or the like. The formation method may include PECVD, ALD, CVD, or the like.

Figure 12A:
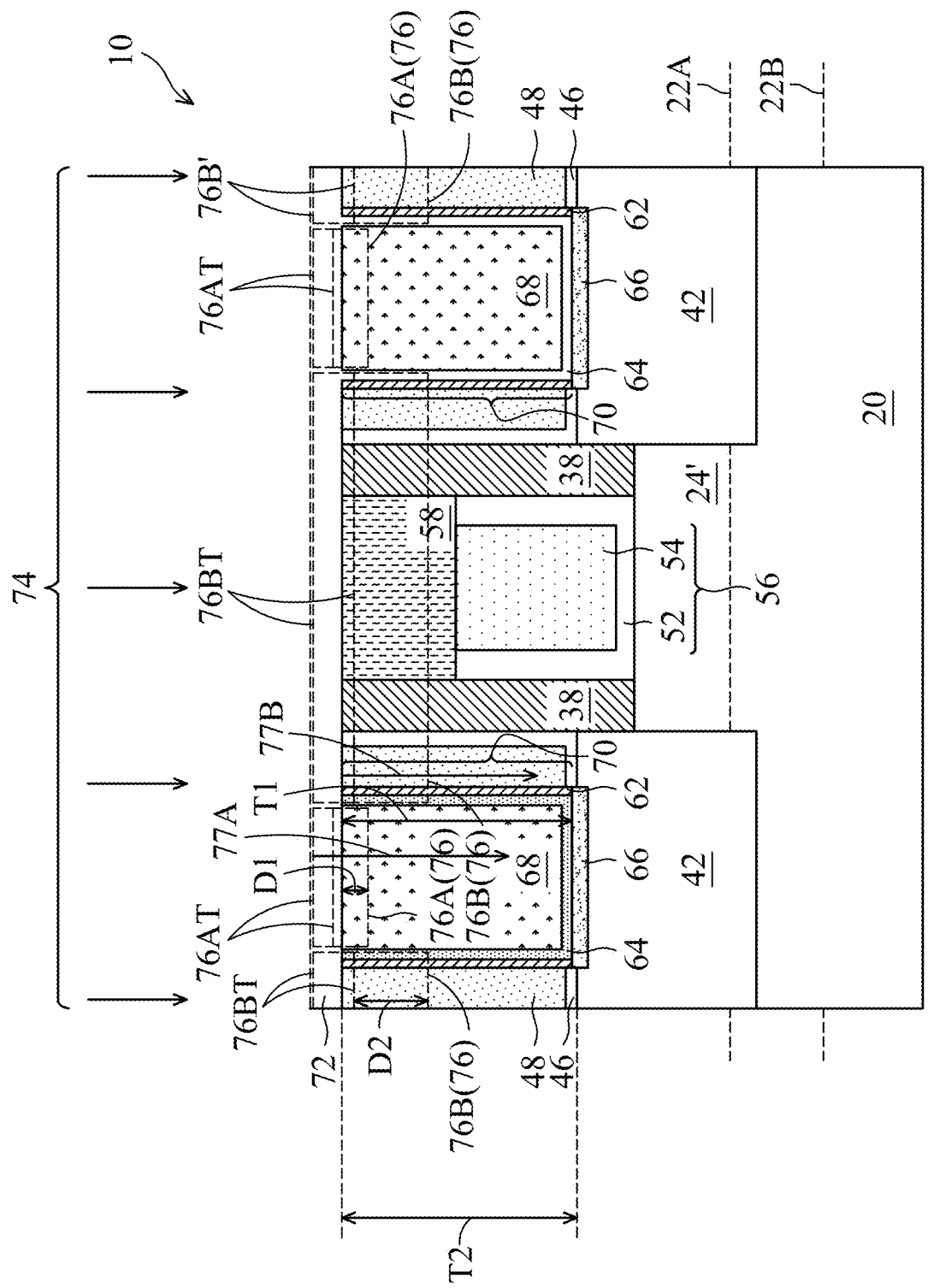

Next, referring to FIG. 12A, an implantation process 74 is performed. The respective process is illustrated as process 224 in the process flow 200 shown in FIG. 22. In the implantation process, a dopant that may modify the etching characteristic of metal region 68, as will be discussed in detail subsequently, is implanted. In accordance with some embodiments, the dopant comprises Ge, Xe, Ar, Si, or combinations thereof. The energy of the implantation is selected to be in a range, which is not too high and not too low. If the implantation energy is too high, the dopant may penetrate through etch stop layer 72, ILD 48 and CESL 46 and reach source/drain regions 42. This may adversely change the property of the resulting FinFET in an uncontrollable way. Furthermore, the dopant may extend into the metal region 68 too deep. This will cause the resulting recess 82 (FIG. 15) to be too deep, defeating the purpose of the implantation. If the implantation energy is too low, the dopant cannot extend into metal region 68 enough, again making the lateral expansion of the recess 82 (FIG. 15) to be difficult since it is difficult to laterally expand recess 82 when it is too shallow. In accordance with some embodiments, the implantation may be performed with an energy in the range between about 2 keV and about 50 keV. The dosage of the dopant is also selected so that it is not too high to change the characteristic of the etch stop layer, implanted ILD 48, CESL 46 too much, and not too low so that the etching characteristic of implanted portions of metal region 68 is not adequately modified. In accordance with some embodiments, the dosage is in the range between about $1E14/cm^2$ and $1E16/cm^2$. The implantation may be performed vertically, or tilted with a tilt angle smaller than about 60 degrees. During the implantation, the wafer 10 may be cooled or heated, or may be at the room temperature. For example, the temperature may be in the range between about $-100°$ C. and about $500°$ C. during the implantation.

Figure 12B:
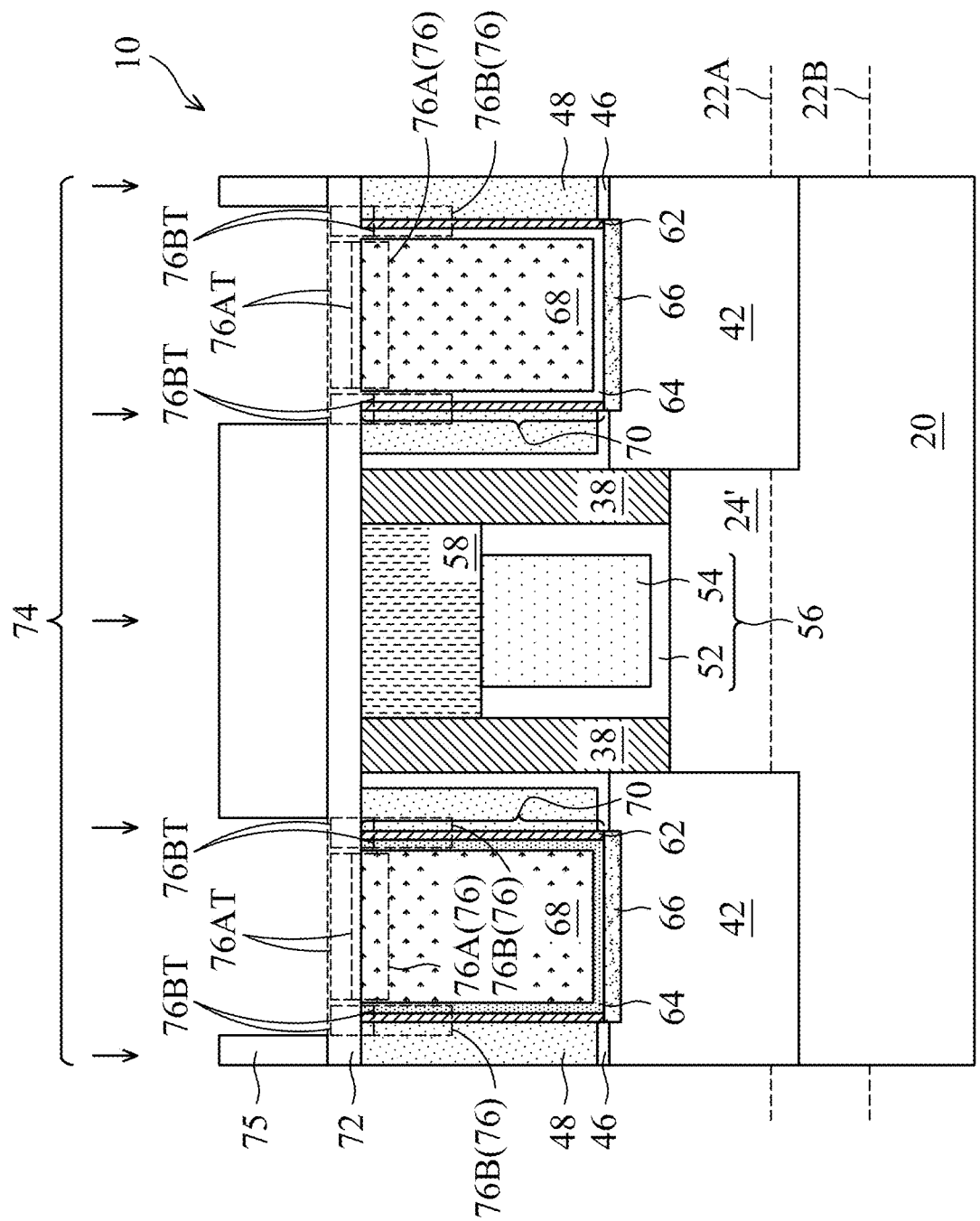

In FIGS. 12A and 12B, etch stop layer 72 is drawn as being dashed to indicate that etch stop layer 72 may be formed before or after the implantation process 74. Accordingly, when the implantation process 74 is performed, etch stop layer 72 may or may not be formed.

Figure 18:
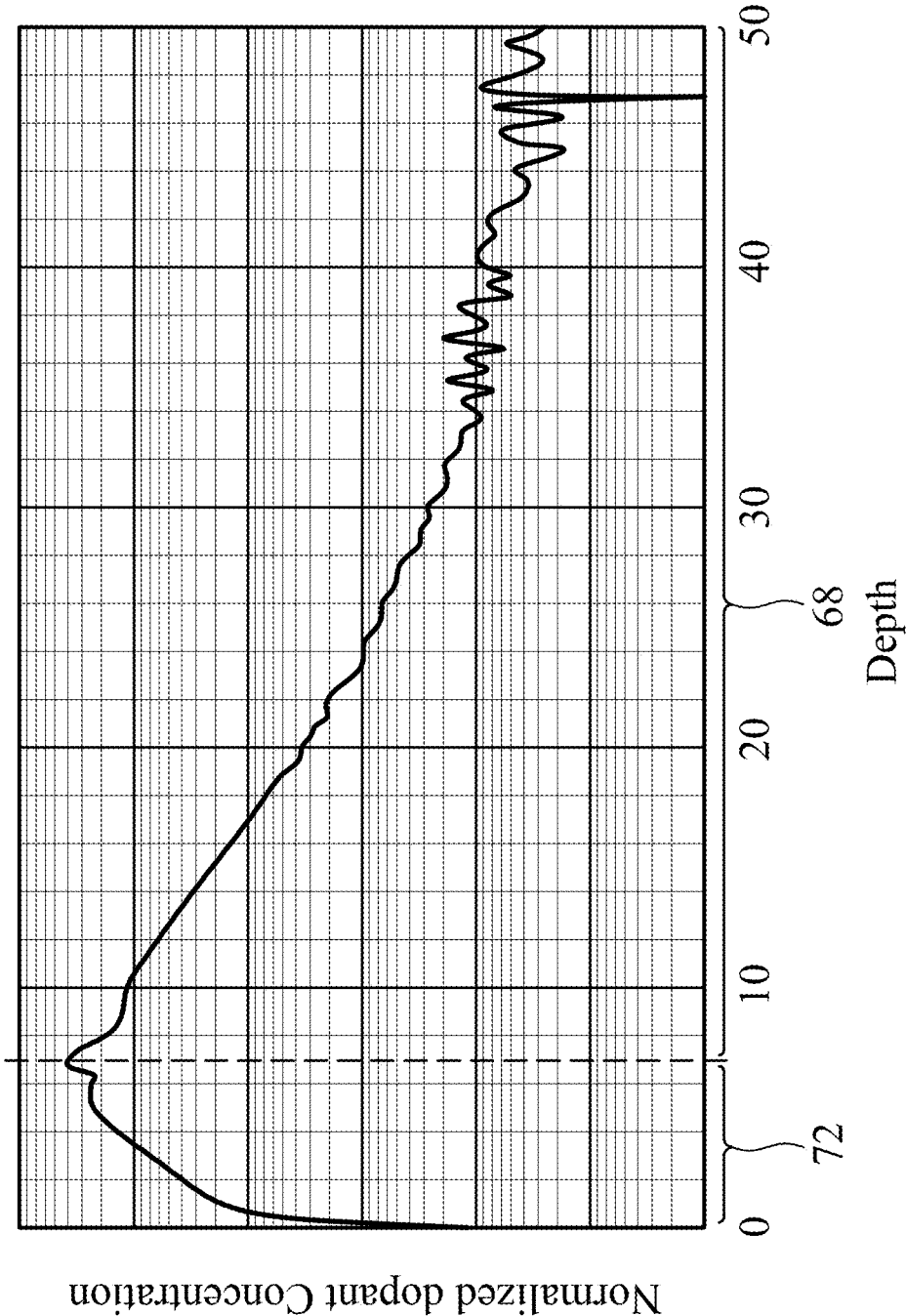
FIGS. 18 and 19 are profiles of implanted species in a contact plug and an inter-level dielectric, respectively, in accordance with some embodiments.
Figure 19:
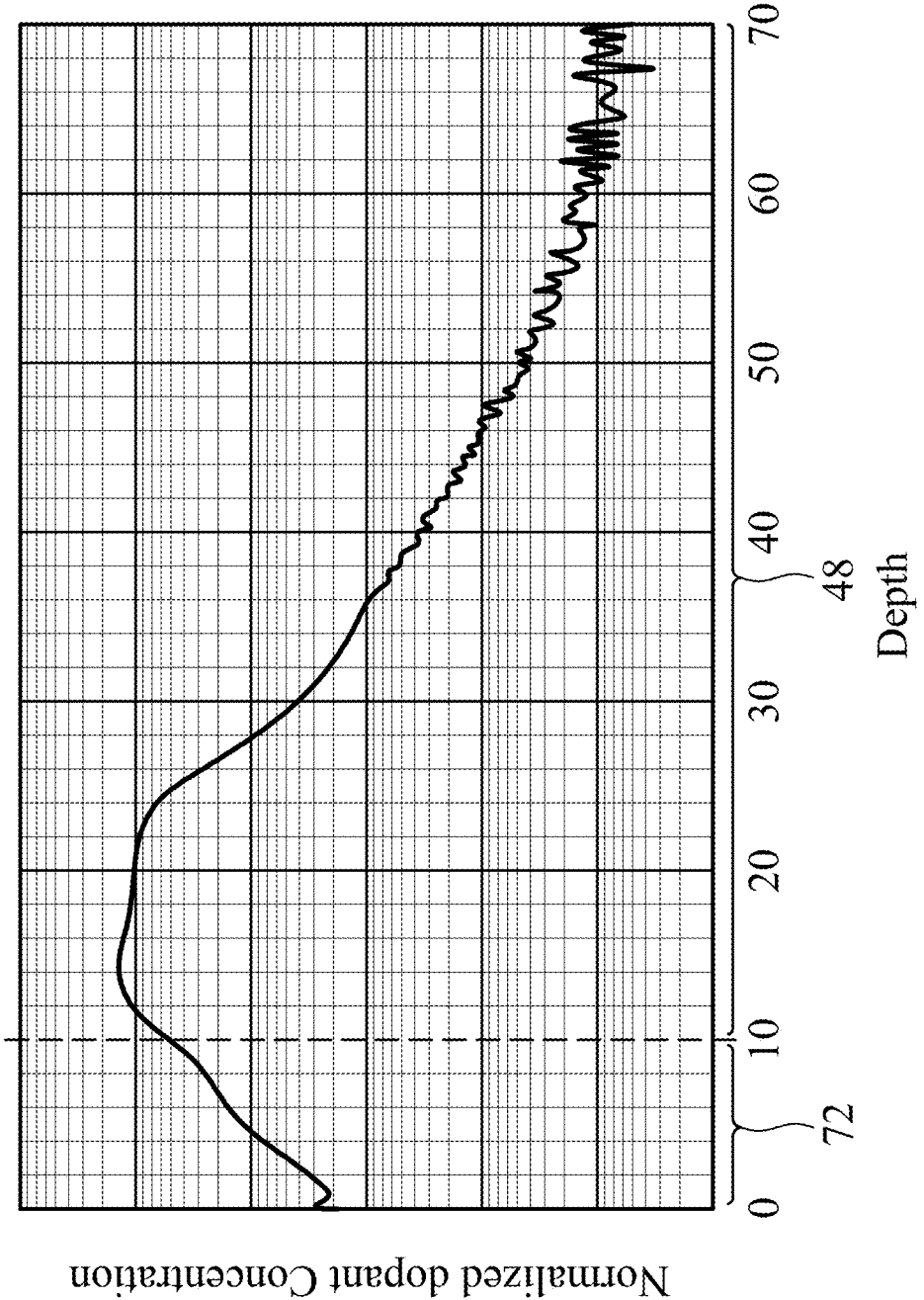

Referring to FIG. 12A, as a result of the implantation, doped regions 76A are formed in metal region 68, and doped regions 76B are formed in dielectric layers such as ILD 48, gate spacers 38, and hard masks 58. Throughout the description, doped regions 76A and 76B are collectively referred to as doped regions 76. The top surfaces of doped regions 76B are drawn as being lower than the top surfaces of doped regions 76A to show that the dopant is more likely to pile up at the top surfaces of metal regions 68. It is appreciated that the subsequent processes may include annealing processes, which causes the doped regions 76A and 76B to diffuse outwardly. Accordingly, the positions and the depths of doped regions 76A and 76B may change before/after anneal due to the diffusion of the implanted species. The doped regions 76A and 76B, however, actually may extend through the entire thickness of etch stop layer 72. The illustrated doped regions 76A and 76B may thus represent the regions with relatively high concentrations, for example, with concentrations smaller than the respective peak concentration values by differences that are smaller than two orders (or may be three orders). The dopant penetrates through etch stop layer 72. It is appreciated that which of the portions of doped region 76B in gate spacers 38 and the portions in the hard masks 58 extend deeper depends on the comparison of the density values of gate spacers 38 and the hard masks 58, and doped regions extend shallower in denser materials. Accordingly, the portions of doped region 76B in gate spacers 38 have similar depths as that in the hard masks 58. Furthermore, the bottoms of the portions of doped region 76B in gate spacers 38 may be higher than, level with, or lower than, the bottoms of the portions of doped region 76B in hard masks 58. In FIGS. 12A and 12B, the possible top surfaces of doped regions 76A and 76B are illustrated. The top surfaces 76BT and 76AT that are level with the top surface of etch stop layer 72 represent the embodiments in which doped regions 76A and 76B extend to the top surface of etch stop layer. Also, as shown in FIGS. 18 and 19, near the boundary between metal region 68 and the overlying etch stop layer 72, there is a sudden change in doping concentration, while there is a less sudden change in doping concentration between ILD 48 and the overlying etch stop layer 72. Also referring to FIGS. 12A and 12B, there is a sudden change in concentration at the boundary between doped regions 76A and their neighboring doped regions 76B.

Since the metal region 68 is denser, and the dielectric layers are relatively sparse, the depth D1 of the doped regions 76A is smaller than the depth D2 of the doped regions 76B in the dielectric layers. In accordance with some embodiments, the depth D1 is smaller than the total thickness T1 of contact plug 70. Also, the depth D2 is smaller than the total thickness T2 of CESL 46 and ILD 48. For example, ratio D1/T1 may be in the range between about 0.05 and about 0.2. Ratio D2/T2 may be in the range between about 0.1 and about 1. Also, ratio D1/D2 may be in the range between about 0.05 and about 0.5. In accordance with some embodiments, depth D1 is in the range between about 1 nm and about 10 nm, and depth D2 is in the range between about 5 nm and about 20 nm.

Figure 20:
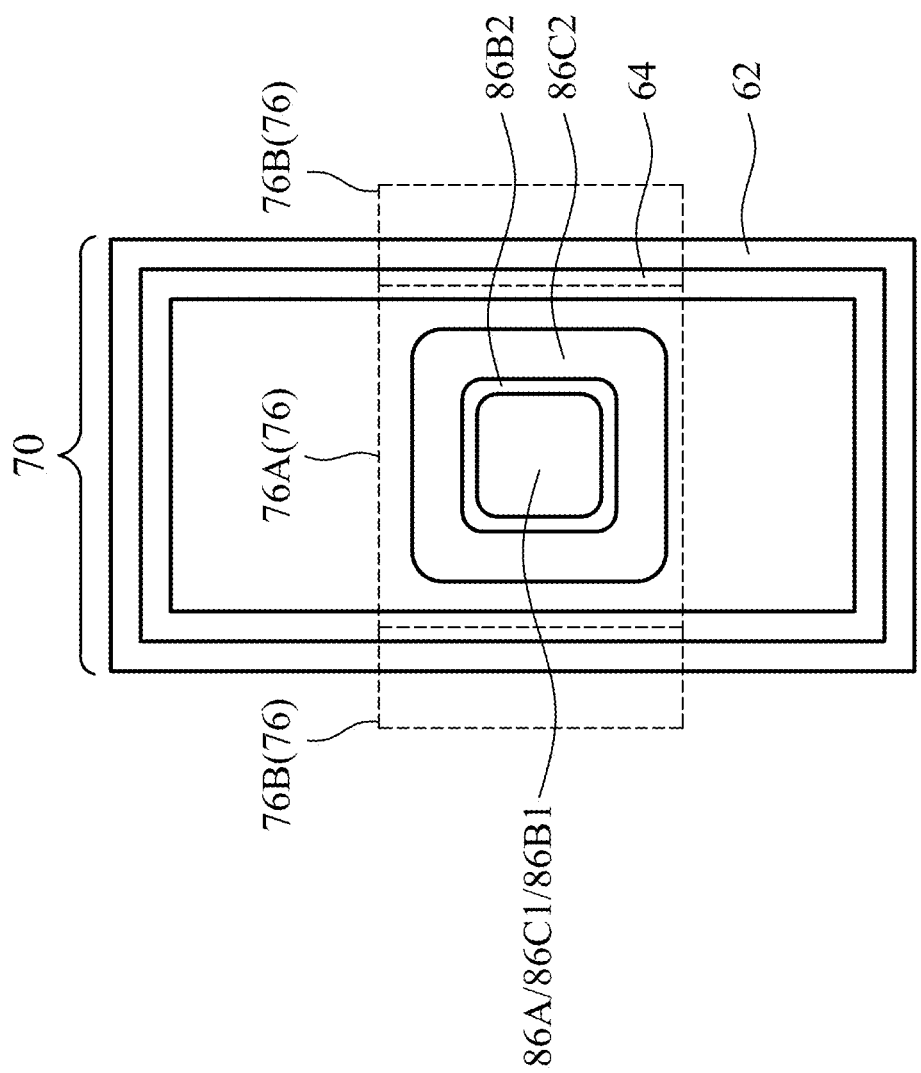
FIG. 20 illustrates a top view of a contact plug in accordance with some embodiments.

In accordance with some embodiments, as shown in FIG. 12A, the implantation is performed on wafer 10 without any implantation mask, so that an entirety of wafer 10 is subject to the implantation, and all surface features of the wafer 10 receive the dopant. In accordance with alternative embodiments, as shown in FIG. 12B, the implantation is performed with implantation mask 75 being formed to mask the regions not to be implanted. For example, assuming the material of the gate electrode 54 is not prone to the loss or corrosion due to the slurry used in subsequent planarization process, implantation mask 75 may cover the gate electrode 54 and the overlying hard masks 58, and may cover gate spacers 38. Furthermore, implantation mask 75 may cover non-transistor regions. FIG. 20 schematically illustrates an implanted region 76A and surrounding implanted regions 76B relative to the underlying contact plug 70 when a mask is adopted.

Since metal region 68 is dense, the dopant is piled up around (both higher than and lower than) the top surface of metal region 68. Also, the dopant may have some portions directly over metal region 68 and extend into at least the lower portions of etch stop layer 72. This causes doped regions 76A to extend into at least the lower portion, and possibly extend into the entirety, of etch stop layer 72. FIG. 18 illustrates a distribution profile of the dopant in metal region 68 and etch stop layer 72 in accordance with some embodiments. The distribution profile is measured on a sample wafer using Secondary-Ion Mass Spectrometry (SIMS). The X-axis shows the depth measured from the top surface of etch stop layer 72 and in the direction marked by arrow 77A in FIG. 12A. The Y-axis shows the normalized dopant concentration. It is observed that the peak dopant concentration of doped region is at the interface between etch stop layer 72 and metal region 68, indicating the pile-up of the dopant at the interface. Also, there is a high concentration of the dopant in etch stop layer 72, which may be caused by the back-scattering from metal region 68. Accordingly, as shown in FIG. 12, doped region 76A is illustrated as extending into etch stop layer 72. In accordance with some embodiments, the dopant concentration in metal region 68 and etch stop layer 72 may be in the range between about $1E17/cm^3$ and about $1E22/cm^3$. The peak dopant concentration in metal region 68 and etch stop layer 72 may be in the range between about $1E20/cm^3$ and about $1E22/cm^3$.

FIG. 19 illustrates a distribution profile of the dopant in ILD 48 and etch stop layer 72 in accordance with some embodiments. The distribution profile is also measured from the sample wafer using SIMS. The X-axis shows the depth measured from the top surface of etch stop layer 72 and in the direction marked by arrow 77B in FIG. 12A. The Y-axis shows the normalized dopant concentration. Since dielectric layers are relatively loose, the peak concentration of the doped regions 76B is inside ILD 48, rather than at the interface between etch stop layer 72 and ILD 48. The dopant in ILD 48 extends deeper than doped region 76A, but has less steep change. In accordance with some embodiments, the dopant concentration in etch stop layer and ILD 48 may be in the range between about $1E17/cm^3$ and about $1E22/cm^3$. The peak dopant concentration in etch stop layer 72 and ILD 48 may be in the range between about $1E17/cm^3$ and about $1E22/cm^3$.

In accordance with some embodiments, the bottom parts of metal regions 68 have a dopant concentration (of the implanted dopant) that is at least three orders (1,000 times) lower than the peak dopant concentration at the interface between metal region 68 and etch stop layer 72. The bottom parts of metal regions 68 may be free from the implanted dopant in accordance with some embodiments. In accordance with some embodiments, the bottom parts of metal ILD 48 and the underlying part of CESL 46 have a dopant concentration (of the implanted dopant) that is at least three orders (1,000 times) or four orders lower than the peak dopant concentration in ILD 48. The bottom parts of ILD 48 may be free from the implanted dopant in accordance with some embodiments.

Figure 13:
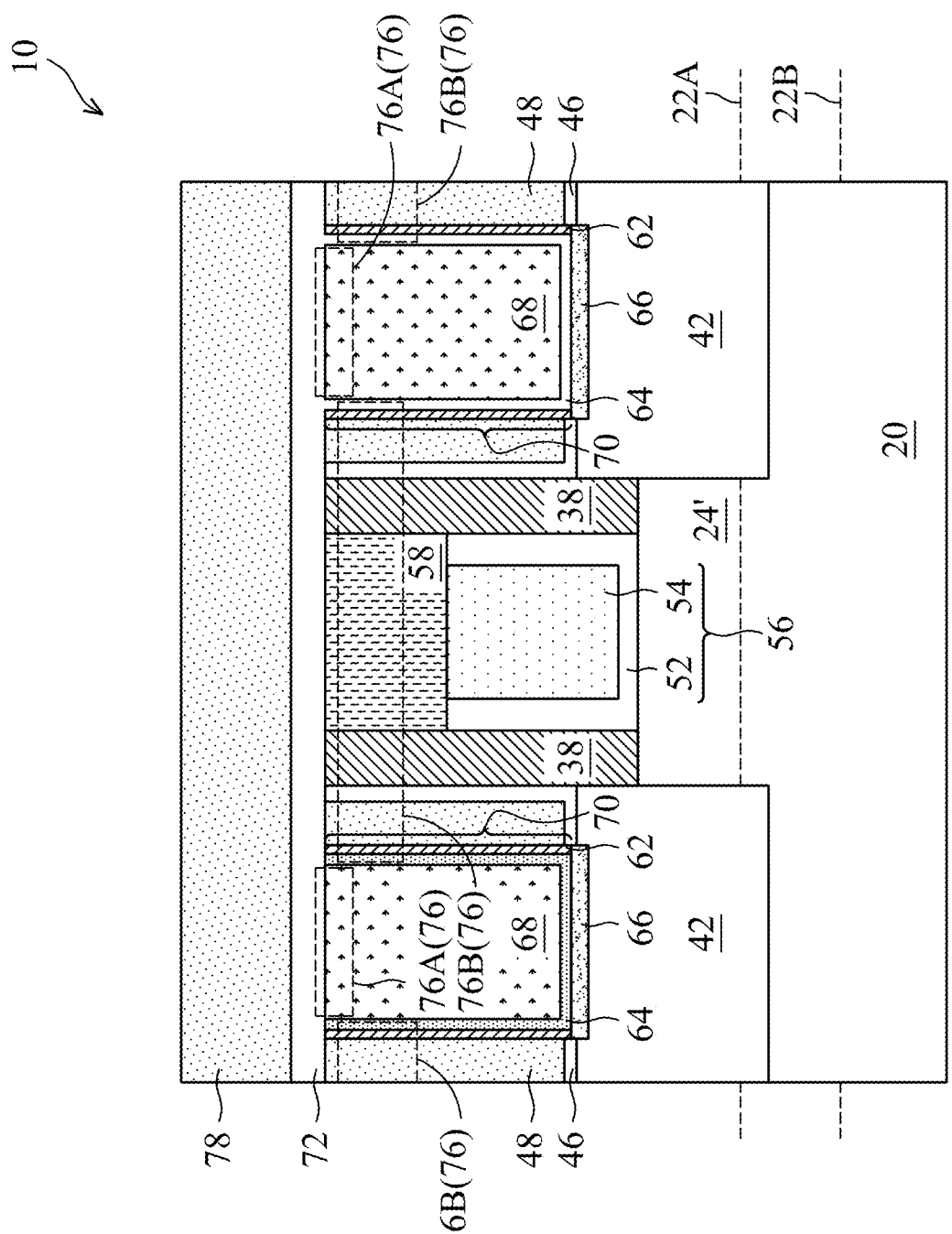

Referring to FIG. 13, ILD 78 is formed over etch stop layer 72. The respective process is illustrated as process 226 in the process flow 200 shown in FIG. 22. The material and the formation method of ILD 78 may be selected from the same candidate materials and formation methods for forming ILD 48. For example, ILD 78 may include silicon oxide, PSG, BSG, BPSG, or the like, which includes silicon therein. In accordance with some embodiments, ILD 78 is formed using PECVD, FCVD, spin-on coating, or the like.

Figure 14:
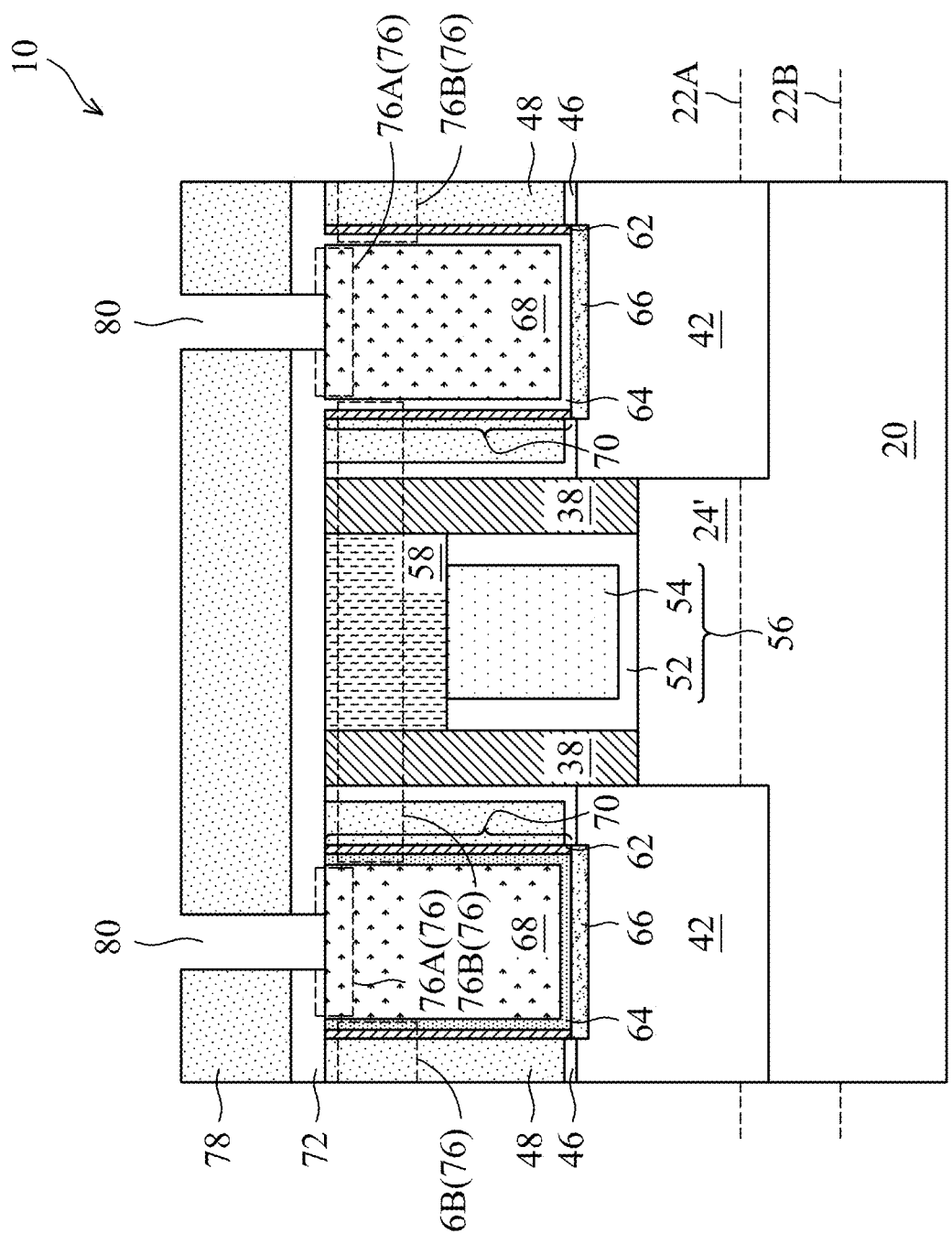

FIG. 14 illustrates the etching of ILD 78 to form source/drain contact openings 80. The respective process is illustrated as process 228 in the process flow 200 shown in FIG. 22. In accordance with some embodiments, ILD 78 is etched using a process gas including $C_2F_6$, $CF_4$, $SO_2$, the mixture of HBr, $Cl_2$, and $O_2$, or the mixture of HBr, $Cl_2$, $O_2$, and $CF_2$ etc. The etching processes are anisotropic.

Next, as also shown in FIG. 14, etch stop layer 72 is etched in an anisotropic process. The respective process is also illustrated as process 228 in the process flow 200 shown in FIG. 22. Source/drain contact plugs 70 are thus exposed to source/drain openings 80. Etch stop layer 72 may be etched using a fluorine-containing gas such as the mixture of $CF_4$, $O_2$, and $N_2$, the mixture of $NF_3$ and $O_2$, $SF_6$, or, the mixture of $SF_6$ and $O_2$. The etching may be anisotropic or isotropic. Accordingly, the portions of openings 80 in etch stop layer 72 may be, or may not be, wider than the portions of openings 80 in ILD 78.

Figure 15:
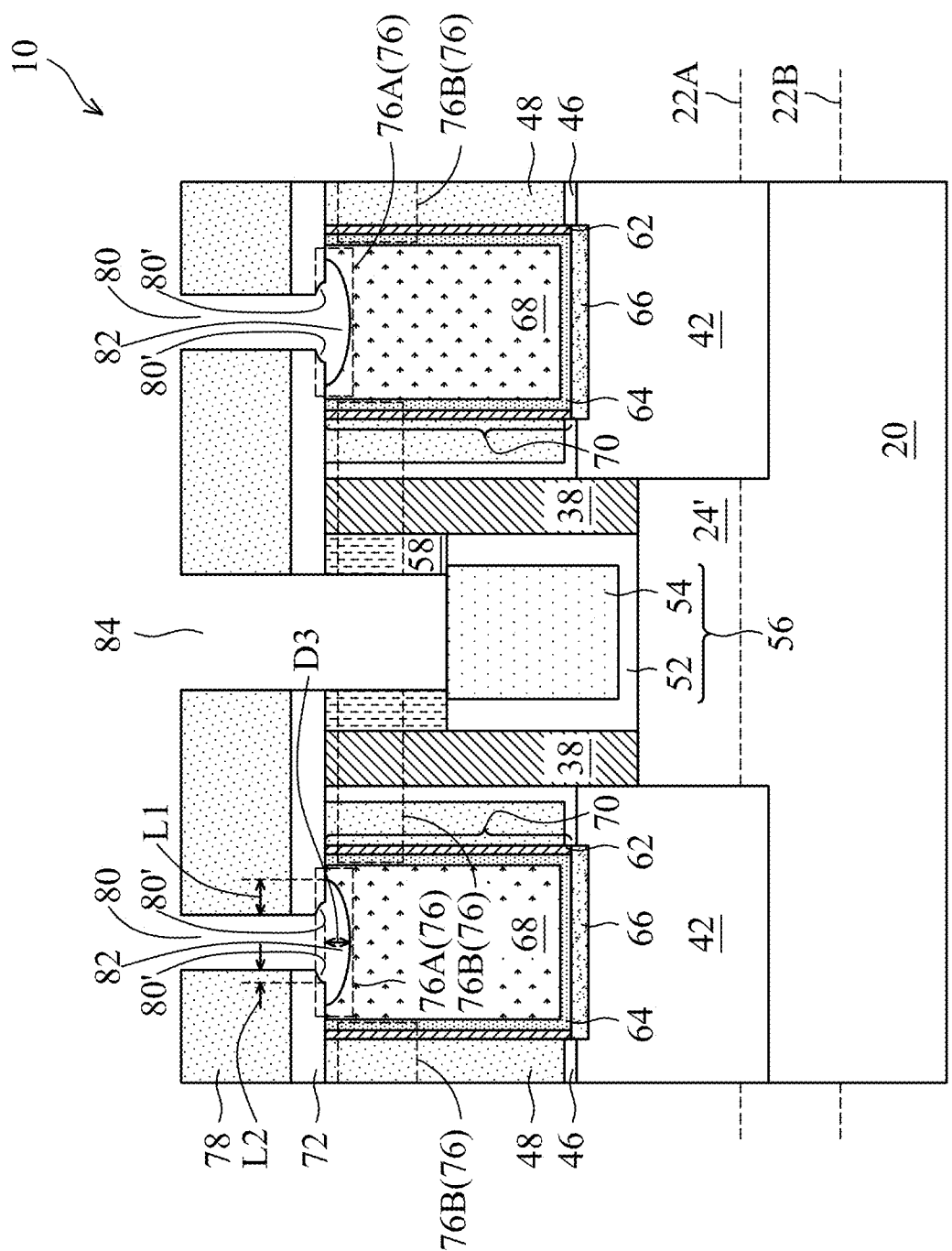

Referring to FIG. 15, an isotropic etching process is performed using an etchant attacking metal region 68. The respective process is illustrated as process 230 in the process flow 200 shown in FIG. 22. Accordingly, recess (opening) 82 is formed in metal region 68. The recess 82 includes three portions: a bigger upward-facing bowl recess, a smaller downward-facing bowl recess over the bigger upward-facing bowl recess, and a through-hole over the smaller downward-facing bowl recess. The bigger upward-facing bowl recess has a curved bottom surface. The smaller downward-facing bowl recess has a curved top surface. The through-hole has substantially straight edges. The etching may include a dry etching process or a wet etching process. Also, the etching chemical is selected not to etch ILD 78 and etch stop layer 72 (except that the dopant-containing portions of etch stop layer 72 may be etched). The etching chemical is also selected in response to the dopant used for forming doped regions 76A, so that the doped regions 76A in metal region 68 have a higher etching rate than the un-doped portions of metal region 68. For example, when a dry etching process is used, the etching gas may include $O_2$, Ar, $C_4F_6$, or the like. When a wet etching process is used, the etching solution may include de-ionized (DI) water, benzotriazole (BTA), HF, or the like. The ratio of the etching rate of doped regions 76A to the etching rate of the undoped (or less doped) bottom portions of metal regions 68 is greater than 1.0, and may be in the range between about 1 and about 5.

Since the doped regions 76A have a higher etching rate than the underlying undoped (or less doped) portions of metal regions 68, the etching is initially fast in the surface portions of metal regions 68 where the dopant concentration is high. When the recess extends into lower portions of metal region 68 wherein the dopant concentration is reduced, the downward etching rate starts to reduce. On the other hand, the lateral etching rate does not reduce since with the proceeding of the lateral etching, the newly etched portions have the same dopant concentrate as the previously etched portions. In accordance with some embodiments, the lateral extending distance L1 of recess 82 may be in the range between about 1 nm and about 15 nm, and the depth D3 of recess 82 may be in the range between about 1 nm and about 20 nm. The ratio L1/D3 is greater than 0.5, and may be greater than about 1. The ratio L1/D3 may also be in the range between about 0.5 and about 1.5.

Further referring to FIG. 15, since the dopant may be back-scattered back from metal region 68 into etch stop layer 72 and pile up in at least the bottom portion of etch stop layer 72, the portions of etch stop layer 72 directly over metal region 68 may be etched in the isotropic etching process, and opening 80 laterally extends into etch stop layer 72 to form opening portions 80'. In accordance with some embodiments, opening portions 80' are in the bottom portion of etch stop layer 72, while the top portion of etch stop layer 72 is not laterally recessed in the isotropic etch, as shown in FIG. 15. In accordance with alternative embodiments, opening portions 80' also extend into the top portion of etch stop layer 72. In accordance with some embodiments, the lateral extending distance L2 of opening portions 80' may be in the range between about 0.5 nm and about 3 nm. Since the etchant is selected to specifically etch metal regions 76A, not for laterally extending etch stop layer 72, the ratio L2/L1 is smaller than 1.0, and may be in the range between about 0.05 and about 0.5.

In accordance with yet other embodiments, for example, when etch stop layer 72 is formed after the implantation process 74 (FIGS. 12A and 12B), etch stop layer 72 has little or no dopant therein, and opening portions 80' are not formed.

Figure 16:
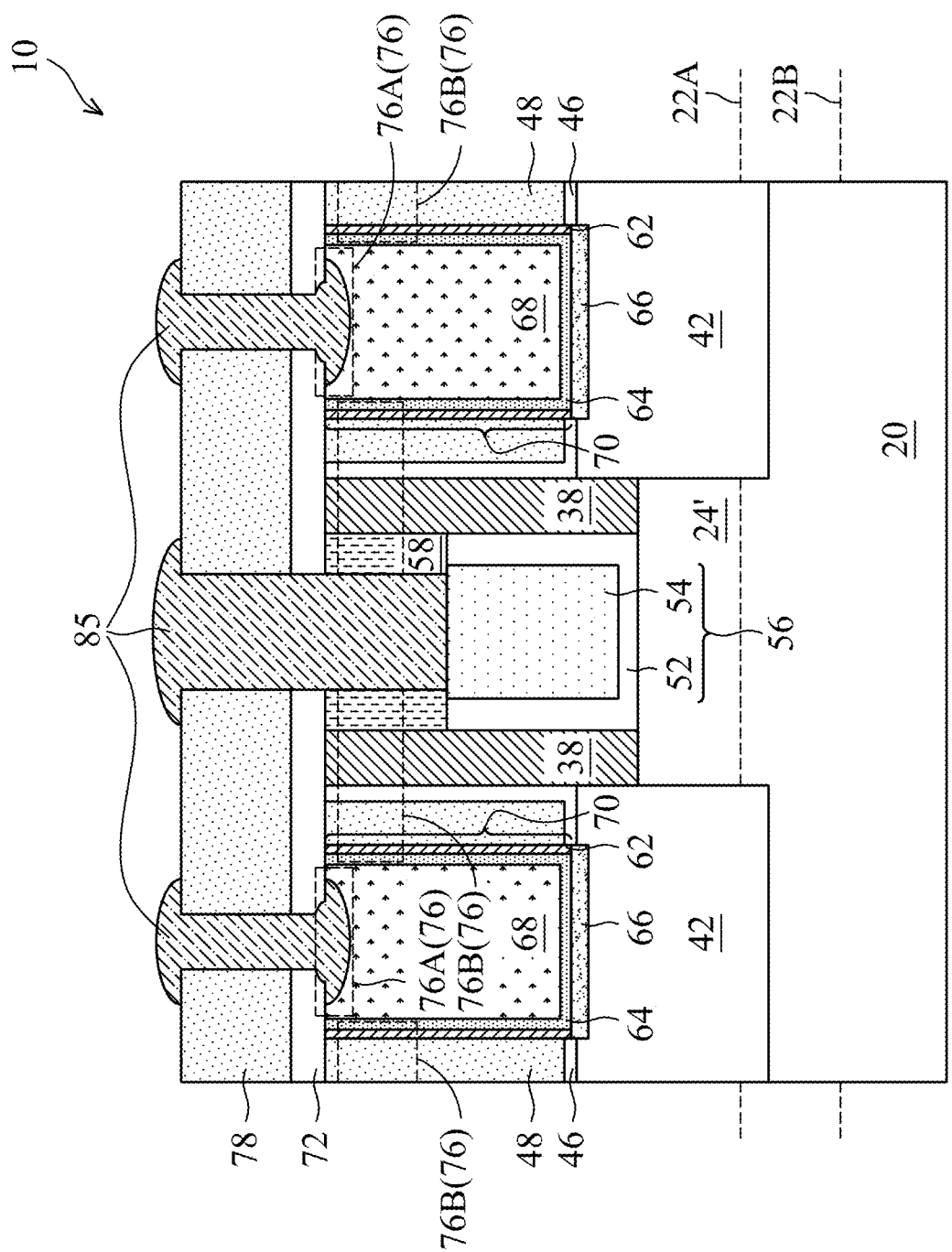
Figure 17:
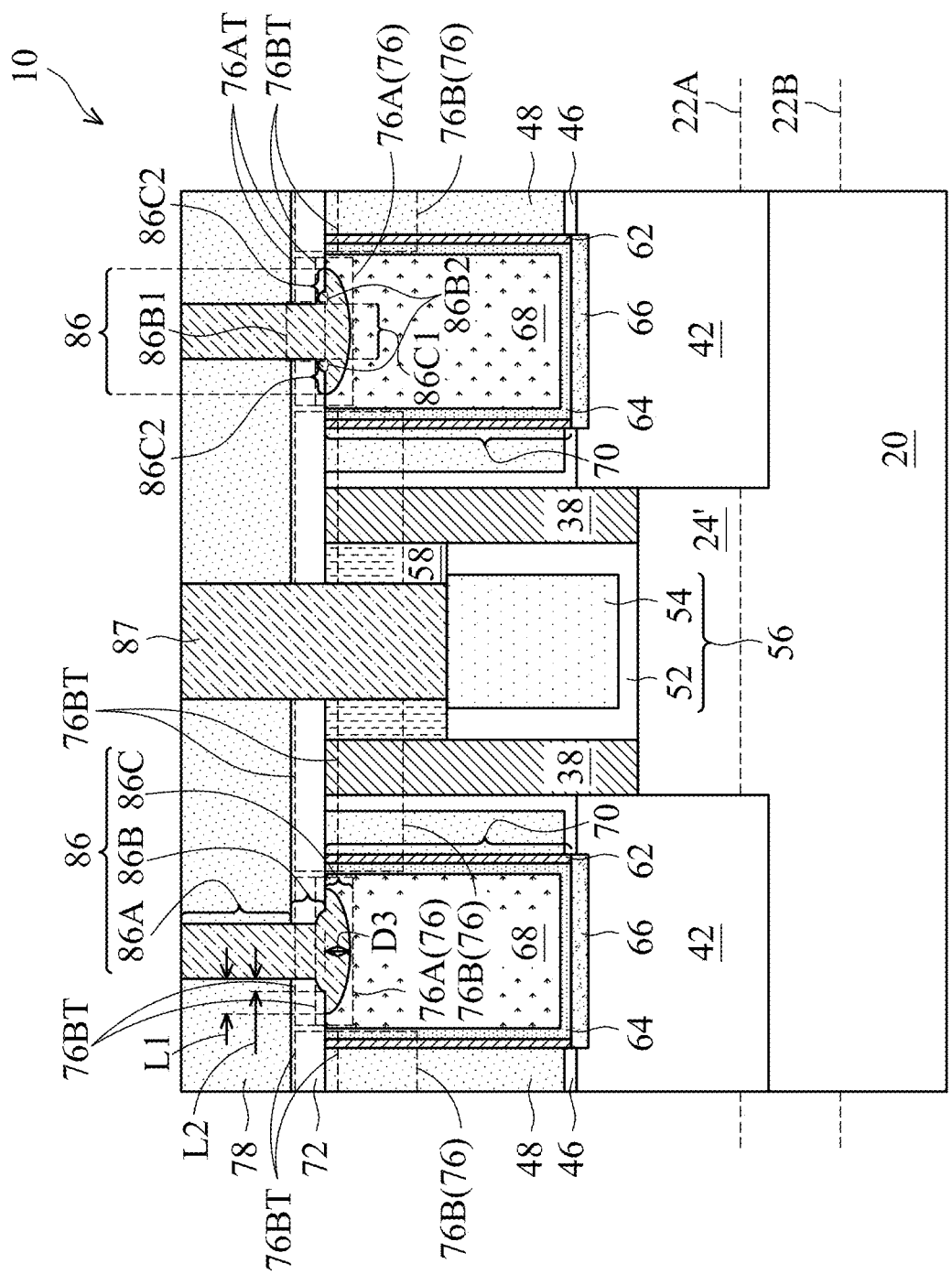
Figure 22:
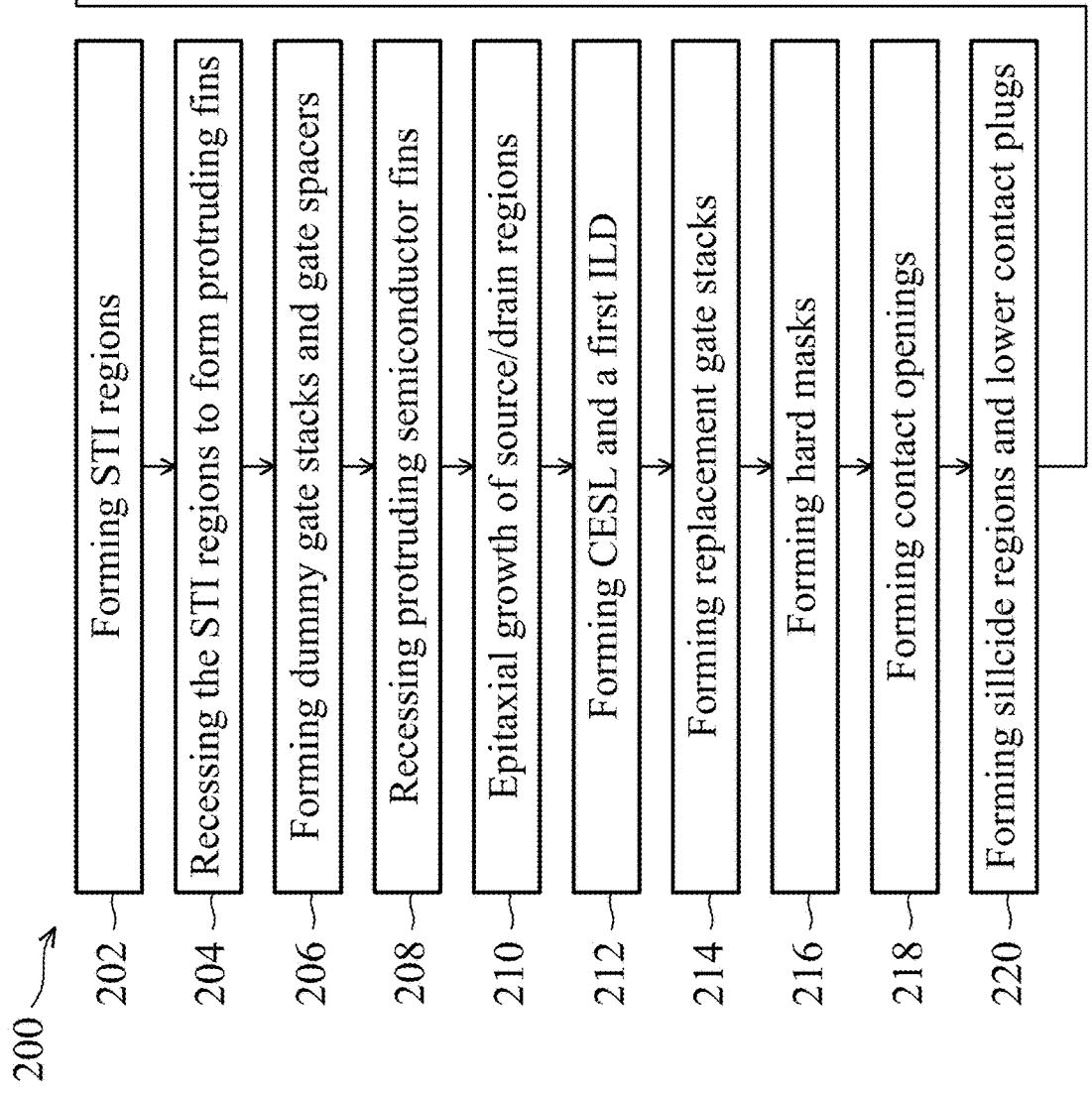
FIG. 22 illustrates a process flow for forming a Fin Field-Effect Transistor (FinFET) and corresponding contact plugs in accordance with some embodiments.

FIG. 15 also illustrates the formation of gate contact opening 84 in accordance with some embodiments, which is formed by etching ILD 78, etch stop layer 72, and hard mask 58. The respective process is illustrated as process 232 in the process flow 200 shown in FIG. 22. In the following discussed example embodiments as shown in FIGS. 16 and 17, gate contact plug 87 and source/drain contact plugs 86 are formed sharing a common metal filling process. It is appreciated that gate contact plug 87 may also be formed before or after the formation of source/drain contact plugs 86. The process 232 as shown in the process flow shown in FIG. 22 is thus drawn as a dashed box to indicate it may or may not be performed at this time.

FIG. 16 illustrates the deposition of metallic material 85, which may be deposited using PVD, CVD, plating, combinations thereof, or the like. The respective process is illustrated as process 234 in the process flow 200 shown in FIG. 22. Metallic material 85 may include tungsten, cobalt, molybdenum, copper, or alloys thereof. Furthermore, the metallic material 85 may be different from the material of metal region 68. For example, when metal region 68 is formed of or comprises cobalt, metallic material 85 may be formed of or comprises tungsten. The entireties of metallic material 85 may be homogenous (and no glue layer is formed). Metallic material 85 may be filled to have top surfaces slightly higher than or lower than the top surface of ILD 78.

In a subsequent process, a planarization process such as a CMP process or a mechanical grinding process is performed to remove excess portions of metallic material 85, hence forming gate contact plug 87 and source/drain contact plugs 86. The respective process is illustrated as process 236 in the process flow 200 shown in FIG. 22. The resulting structure is shown in FIG. 17. In accordance with some embodiments, the CMP is performed using an acidic slurry. In accordance with other embodiments, the CMP is performed using an alkaline slurry. In accordance with some embodiments, the selected slurry does not corrode gate contact plug 87 and source/drain contact plugs 86, but may corrode contact plugs 70.

A contact plug 86 includes top portion 86A in ILD 78, with portion 86A having substantially straight edges. The bottom portion 86C is in metal region 68, and includes portion 86C1, which is directly underlying contact plug portion 86A, and portions 86C2, which are on opposing sides of portion 86A, and are directly underlying ILD 78. When viewed from the top of contact plug 86, portions 86C2 form a full ring encircling portion 86C1 (as shown in FIG. 20). Also, contact plug 86 includes portion 86B in etch stop layer 72, and the contact plug portion 86B also includes portion 86B1, which is directly underlying contact plug portion 86A, and portions 86B2, which are on opposing sides of portion 86B1, and are directly underlying ILD 78. When viewed from the top of contact plug 86, portions 86B2 form a full ring encircling portion 86B1 (as shown in FIG. 20). The sizes of contact plug portions 86A, 86B, and 86C are the same as the corresponding opening 80 and recess 82 (FIG. 15), and hence then shapes and dimensions are not repeated herein.

In accordance with yet other embodiments, for example, when etch stop layer 72 is formed after the implantation process 74 (FIGS. 12A and 12B), etch stop layer 72 has little or no dopant therein, and portions 86B2 are not formed.

Gate contact plug 87 and source/drain contact plug 86 are glue-layer-less contact plugs, with no glue layers formed to adhere the metallic material 85 (FIG. 16) to ILD 78. Accordingly, due to the inferior adhesion of contact plugs 87/86 to ILD 78 and etch stop layer 72, there may be seams (not shown) separating contact plugs 87/86 and ILD 78 from etch stop layer 72. The slurry used in the planarization of metallic material 85 may pass through the seams. If there are no expanded portions 86C, or the expanded portions 86C are not big enough, the slurry 88 may reach metal region 68. In accordance with some embodiments, metal region 68 is formed of a material (such as cobalt) different from the material (such as tungsten) of contact plugs 87 and 86. Contact plugs 87 and 86 may not suffer from the corrosion of the slurry (which may be acidic), while metal region 68 may suffer from the corrosion from slurry 88 in accordance with some embodiments. With the enlarged contact extension portions 86C, the slurry is blocked from reaching metal region 68, and the corrosion is at least reduced, and possibly eliminated.

Figure 21:
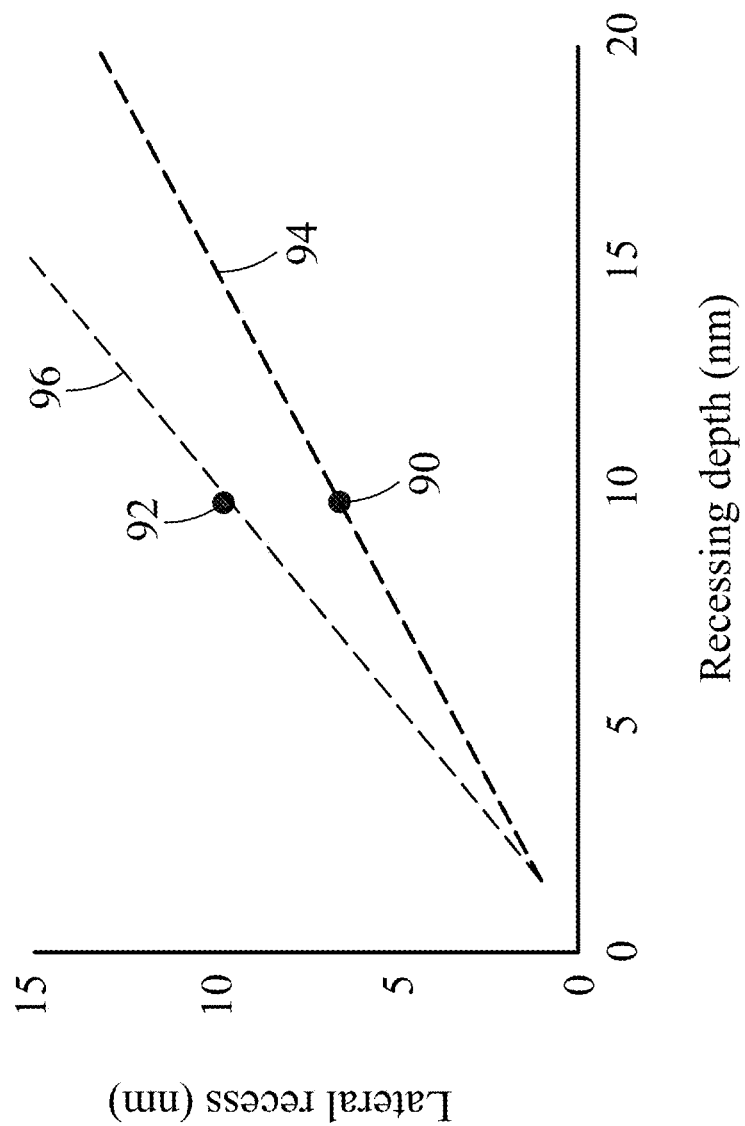
FIG. 21 illustrates the plot of lateral recessing distances verses recessing depths in accordance with some embodiments.

FIG. 21 illustrates the lateral recessing distance (for example, L1 in FIG. 15) as a function of recessing depth (for example, D3 in FIG. 15). Dot 90 is an experiment result obtained by forming openings 80 and 82 (FIG. 15) without the implanting process for doping the dopant. Dot 92 is an experiment result obtained by forming openings 80 and 82 with the implanting process performed by implanting germanium. The results indicate that when the recessing depth is 10 nm, the lateral recessing distance is increased by about 50 percent when the embodiments of the present disclosure are adopted. Lines 94 and 96 are expected plot of the lateral recessing distance as a function of the recessing depth.

The embodiments of the present disclosure have some advantageous features. By implanting a top portion of a lower-level contact plug, the etching selectivity between the top portion and a respective lower portion of the lower-level contact plug is increased. In the recessing of the lower-level contact plug for forming an upper-level contact plug, lateral recessing is increased without increasing vertical recessing. The bottom portion of the resulting upper-level contact plug is thus laterally expanded, and has improved ability for blocking slurry, which may cause the corrosion of the lower-level contact plug.

In accordance with some embodiments of the present disclosure, a method includes forming a metallic feature; forming an etch stop layer over the metallic feature; implanting the metallic feature with a dopant; forming a dielectric layer over the etch stop layer; performing a first etching process to etch the dielectric layer and the etch stop layer to form a first opening; performing a second etching process to etch the metallic feature and to form a second opening in the metallic feature, wherein the second opening is joined with the first opening; and filling the first opening and the second opening with a metallic material to form a contact plug. In an embodiment, in the implanting, an element selected from the group consisting of Ge, Xe, Ar, Si, and combinations thereof is implanted. In an embodiment, in the implanting, germanium is implanted. In an embodiment, in the implanting the metallic feature, a top portion of the metallic feature is implanted, and a bottom portion of the metallic feature is not implanted. In an embodiment, the metallic feature is formed in an additional dielectric layer, and wherein a top portion of the additional dielectric layer is implanted, and a bottom portion of the additional dielectric layer is not implanted. In an embodiment, the implanting is performed after the etch stop layer is formed, with the dopant penetrating through the etch stop layer. In an embodiment, the implanting is performed before the etch stop layer is formed. In an embodiment, the first etching process comprises an anisotropic etching process. In an embodiment, the second etching process comprises an isotropic etching process.

In accordance with some embodiments of the present disclosure, a structure includes a first dielectric layer; a metallic feature in the first dielectric layer, wherein an upper portion of the metallic feature comprises a dopant having a first dopant concentration, and a lower portion of the metallic feature has a second dopant concentration of the dopant smaller than the first dopant concentration; a second dielectric layer over the metallic feature; and a contact plug comprising a first portion penetrating through the second dielectric layer; and a second portion in the metallic feature, wherein the second portion laterally extends beyond edges of the first portion, and the second portion has a bottom in the upper portion of the metallic feature. In an embodiment, the dopant comprises germanium. In an embodiment, the lower portion is substantially free from the dopant. In an embodiment, the structure further includes an etch stop layer between the metallic feature and the second dielectric layer, and the contact plug further comprises a third portion in the etch stop layer. In an embodiment, the third portion of the contact plug comprises a first sub portion directly underlying and overlapped by the first portion of the contact plug; and a second sub portion forming a ring encircling the first sub portion, wherein the second sub portion extends laterally beyond edges of the first portion of the contact plug. In an embodiment, the second sub portion has a height smaller than a thickness of the etch stop layer. In an embodiment, the etch stop layer further comprises the dopant. In an embodiment, the metallic feature comprises cobalt, and the contact plug comprises tungsten, with the tungsten in physical contact with the metallic feature, and the second dielectric layer.

In accordance with some embodiments of the present disclosure, a structure includes a source/drain region; a silicide region over and contacting the source/drain region; a first inter-layer dielectric; a first contact plug over and contacting the silicide region, with the first contact plug being in the first inter-layer dielectric; an etch stop layer over and contacting the first contact plug; a second inter-layer dielectric over and contacting the etch stop layer; and a second contact plug comprising a first portion in the second inter-layer dielectric; a second portion in the etch stop layer, wherein at least a lower part of the second portion extends laterally beyond edges of the first portion; and a third portion extending into the first contact plug, wherein the third portion extends laterally beyond edges of the second portion. In an embodiment, the etch stop layer and an upper part of the first contact plug comprises a dopant, with both of the third portion and the at least the lower part of the second portion being in the dopant. In an embodiment, an upper part of the second portion of the second contact plug comprises edges that are flush with the edges of the first portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a first dielectric layer;
   a metallic feature in the first dielectric layer, wherein an upper portion of the metallic feature comprises a dopant having a first dopant concentration, and a lower portion of the metallic feature has a second dopant concentration of the dopant smaller than the first dopant concentration;
   a second dielectric layer over the metallic feature; and
   an etch stop layer between the metallic feature and the second dielectric layer;
   a contact plug comprising:
      a first portion penetrating through the second dielectric layer;
      a second portion in the metallic feature, wherein the second portion laterally extends beyond edges of the first portion, and the second portion has a bottom in the upper portion of the metallic feature; and
      a third portion in the etch stop layer, wherein the third portion comprises:
         a first sub portion directly underlying and overlapped by the first portion of the contact plug; and
         a second sub portion forming a ring encircling the first sub portion, wherein the second sub portion extends laterally beyond edges of the first portion of the contact plug.

2. The structure of claim 1, wherein the dopant comprises germanium.

3. The structure of claim 1, wherein the lower portion is substantially free from the dopant.

4. The structure of claim 1, wherein the second sub portion has a height smaller than a thickness of the etch stop layer.

5. The structure of claim 1, wherein the third portion comprises a portion having a rounded top surface.

6. The structure of claim 1, wherein the etch stop layer further comprises the dopant.

7. The structure of claim 1, wherein the second portion comprises a rounded bottom surface extending from a top surface of the metallic feature into the metallic feature.

8. The structure of claim 1, wherein the metallic feature comprises cobalt, and the contact plug comprises tungsten, with the tungsten in physical contact with the metallic feature and the second dielectric layer.

9. The structure of claim 1, wherein the first dielectric layer comprises:
   an additional upper portion comprising the dopant; and
   an additional lower portion lower than and continuously connected to the additional upper portion, wherein the additional lower portion is free from the dopant.

10. The structure of claim 1, wherein the third portion of the contact plug has a top portion and a bottom portion, with the bottom portion being wider than the top portion.

11. A structure comprising:
    a gate stack;
    a gate spacer contacting a sidewall of the gate stack;

a source/drain region aside of the gate spacer;
a silicide region over and contacting the source/drain region;
a first inter-layer dielectric;
a first contact plug over and contacting the silicide region, with the first contact plug being in the first inter-layer dielectric;
an etch stop layer over and contacting the first contact plug;
a second inter-layer dielectric over and contacting the etch stop layer; and
a second contact plug comprising:
   a first portion in the second inter-layer dielectric;
   a second portion in the etch stop layer, wherein at least a lower part of the second portion extends laterally beyond edges of the first portion, wherein the lower part of the second portion has a curved surface; and
   a third portion extending into the first contact plug, wherein the third portion extends laterally beyond edges of the second portion.

12. The structure of claim 11, wherein the etch stop layer and an upper part of the first contact plug comprises a dopant, and wherein both of the third portion of the second contact plug and the at least the lower part of the second portion are free from the dopant.

13. The structure of claim 11, wherein an upper part of the second portion of the second contact plug comprises edges that are flushed with the edges of the first portion.

14. The structure of claim 11, wherein the third portion has a rounded bottom surface, and wherein a same metallic material extends from the rounded bottom surface of the third portion to a top surface of the first portion to form the second contact plug.

15. The structure of claim 11, wherein the first portion has straight and vertical sidewalls, and wherein sidewalls of the second portion are curved.

16. The structure of claim 11, wherein the lower part of the second portion comprises lower portions increasingly wider than respective upper portions.

17. The structure of claim 11, wherein the lower part of the second portion further comprises a curved sidewall, wherein the curved top surface is connected to the curved sidewall.

18. The structure of claim 13, wherein the edges of the upper part of the second portion of the second contact plug are straight.

19. A structure comprising:
a first dielectric layer;
a first contact plug in the first dielectric layer, wherein upper portions of the first contact plug and the first dielectric layer comprise a dopant having first dopant concentrations, and lower portions of the first contact plug and the first dielectric layer are free from the dopant, and wherein the dopant extends deeper into the first dielectric layer than into the first contact plug;
a second dielectric layer over the first contact plug; and
a second contact plug comprising:
   a first portion penetrating through the second dielectric layer; and
   a second portion in the first contact plug, wherein the second portion is laterally wider than the first portion, and wherein the first portion and the second portion are continuously connected without distinguishable interface in between.

20. The structure of claim 19, wherein the dopant comprises germanium.

* * * * *